United States Patent
Uchida

(10) Patent No.: US 11,320,285 B2
(45) Date of Patent: May 3, 2022

(54) MAGNETIC SENSOR WITH YOKE AND SHIELD

(71) Applicant: TDK CORPORATION, Tokyo (JP)

(72) Inventor: Keisuke Uchida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 197 days.

(21) Appl. No.: 16/165,254

(22) Filed: Oct. 19, 2018

(65) Prior Publication Data

US 2019/0301894 A1 Oct. 3, 2019

(30) Foreign Application Priority Data

Mar. 27, 2018 (JP) .............................. JP2018-060541

(51) Int. Cl.
*G01D 5/16* (2006.01)

(52) U.S. Cl.
CPC ....................................... *G01D 5/16* (2013.01)

(58) Field of Classification Search
CPC . G01D 5/145; G01D 5/16; G02B 7/02; G02B 7/04; G01R 33/0076; G01R 33/09; G01R 33/093; G01R 33/098; G03B 2205/0069; G03B 3/10
USPC .................................................. 324/207.21
See application file for complete search history.

(56) References Cited

U.S. PATENT DOCUMENTS

| | | | |
|---|---|---|---|
| 4,361,805 A | 11/1982 | Narimatsu et al. | |
| 2007/0252591 A1* | 11/2007 | Babin | G01D 5/2515 324/207.25 |
| 2008/0297954 A1* | 12/2008 | Aiso | B82Y 25/00 360/324.11 |
| 2012/0200292 A1* | 8/2012 | Sugihara | H01L 43/08 324/252 |
| 2015/0192432 A1 | 7/2015 | Noguchi et al. | |
| 2015/0323346 A1* | 11/2015 | Maiterth | G01D 5/14 324/207.22 |
| 2016/0266218 A1* | 9/2016 | Tanabe | G01R 33/093 |
| 2016/0313122 A1* | 10/2016 | Bhattacharyya | G01R 33/093 |
| 2017/0176545 A1* | 6/2017 | Deak | G01R 33/0206 |
| 2017/0328963 A1* | 11/2017 | Schmitt | G01R 33/098 |
| 2018/0113176 A1* | 4/2018 | Nagata | G01R 33/0005 |
| 2018/0246177 A1* | 8/2018 | Deak | G01R 33/09 |
| 2018/0275217 A1* | 9/2018 | Uchida | G01R 33/098 |

(Continued)

FOREIGN PATENT DOCUMENTS

| | | |
|---|---|---|
| JP | 2018-044789 A | 3/2018 |
| WO | 2017/018056 A1 | 2/2017 |

*Primary Examiner* — Jay Patidar
(74) *Attorney, Agent, or Firm* — Oliff PLC

(57) ABSTRACT

A magnetic sensor includes a magnetic field conversion unit, a magnetic field detection unit, and two shields. The magnetic field conversion unit includes a plurality of yokes. Each yoke is shaped to be long in a Y direction, and is configured to receive an input magnetic field and output an output magnetic field. The input magnetic field contains an input magnetic field component in a direction parallel to a Z direction, and a magnetic field component in a direction parallel to the Y direction. The output magnetic field contains an output magnetic field component in a direction parallel to an X direction. The magnetic field detection unit generates a detection value according to the output magnetic field component. Each shield has such a shape that its maximum dimension in the Y direction is smaller than its maximum dimension in the X direction.

13 Claims, 14 Drawing Sheets

(56) References Cited

U.S. PATENT DOCUMENTS

| | | |
|---|---|---|
| 2018/0275218 A1 | 9/2018 | Umetsu |
| 2018/0275219 A1 | 9/2018 | Umetsu |
| 2019/0041473 A1 | 2/2019 | Tanabe |
| 2019/0383646 A1* | 12/2019 | Lassalle-Balier ........ G01D 5/16 |

* cited by examiner

MAGNETIC SENSOR WITH YOKE AND SHIELD

BACKGROUND OF THE INVENTION

1. Field of the Invention

The present invention relates to a magnetic sensor, and a magnetic sensor system including the magnetic sensor.

2. Description of the Related Art

Magnetic sensors have been used for a variety of applications. An example of systems that include magnetic sensors is a position detection device, which includes a magnetic sensor and a magnet that is variable in position relative to the magnetic sensor.

Examples of known magnetic sensors include one that uses a spin-valve magnetoresistive element provided on a substrate. The spin-valve magnetoresistive element includes a magnetization pinned layer having a magnetization whose direction is fixed, a free layer having a magnetization whose direction is variable according to the direction of an applied magnetic field, and a gap layer disposed between the magnetization pinned layer and the free layer. In many cases, the spin-valve magnetoresistive element provided on a substrate is configured to have sensitivity to a magnetic field in a direction parallel to the surface of the substrate.

On the other hand, a system including a magnetic sensor may be intended to detect a magnetic field in a direction perpendicular to the surface of a substrate by using a magnetoresistive element provided on the substrate. An example of such a system is described in US 2015/0192432 A1.

US 2015/0192432 A1 discloses a magnetic sensor for detecting the position of a magnet. In the magnetic sensor, magnetoresistive elements are provided on a substrate, and the magnet is provided above the substrate. The magnetic sensor includes a soft magnetic body provided between the magnet and the magnetoresistive elements. The soft magnetic body converts a perpendicular magnetic field component of a magnetic field generated by the magnet into an output magnetic field component, and supplies the output magnetic field component to the magnetoresistive elements. The perpendicular magnetic field component is a component in a direction perpendicular to the surface of the substrate. The output magnetic field component is a component in a direction parallel to the surface of the substrate, to which the magnetoresistive elements have sensitivity.

In the magnetic sensor described in US 2015/0192432 A1, the magnetic field generated by the magnet and applied to the soft magnetic body and the magnetoresistive elements contains not only the foregoing perpendicular magnetic field component but also a horizontal magnetic field component in a direction parallel to the surface of the substrate. In such a case, the magnetoresistive elements are subjected not only to the output magnetic field component supplied from the soft magnetic body but also to the horizontal magnetic field component generated by the magnet. The direction of the output magnetic field component and that of the horizontal magnetic field component are orthogonal to each other. Of the two magnetic field components, it is the output magnetic field component that is originally intended to be detected by the magnetoresistive elements. If the horizontal magnetic field component is large in magnitude, the magnetic sensor thus suffers problems resulting from the horizontal magnetic field component, such as generation of error in the detection value of the magnetic sensor, and reduction in the sensitivity of the magnetic sensor.

SUMMARY OF THE INVENTION

It is an object of the present invention to provide a magnetic sensor including a magnetic field detection unit and a magnetic field conversion unit, the magnetic field conversion unit converting an input magnetic field component in a predetermined direction of an input magnetic field into an output magnetic field component and supplying the output magnetic field component to the magnetic field detection unit, the magnetic sensor being able to prevent the problems arising in the case where the input magnetic field contains not only the input magnetic field component but also a magnetic field component in a direction different from the direction of the input magnetic field component, and to provide a magnetic sensor system including such a magnetic sensor.

A magnetic sensor of the present invention includes a magnetic field conversion unit, a magnetic field detection unit, and at least one shield formed of a soft magnetic material. The magnetic field conversion unit includes at least one yoke formed of a soft magnetic material. The at least one yoke is configured to receive an input magnetic field for the magnetic sensor and to output an output magnetic field. The input magnetic field contains an input magnetic field component in a direction parallel to a first direction. When viewed in the direction parallel to the first direction, the at least one yoke has a shape that is long in a second direction intersecting the first direction. The output magnetic field contains an output magnetic field component in a direction parallel to a third direction intersecting the first and second directions, the output magnetic field component varying according to the input magnetic field component. The magnetic field detection unit is configured to receive the output magnetic field and to generate a detection value that varies according to the output magnetic field component. When viewed in the direction parallel to the first direction, the at least one shield has such a shape that its maximum dimension in the second direction is smaller than its maximum dimension in the third direction, and is located to overlap the magnetic field conversion unit and the magnetic field detection unit.

In the magnetic sensor of the present invention, when viewed in the direction parallel to the first direction, the magnetic field conversion unit and the magnetic field detection unit may be located inside the perimeter of the at least one shield.

In the magnetic sensor of the present invention, the first, second and third directions may be orthogonal to one another.

In the magnetic sensor of the present invention, the magnetic field detection unit may include at least one magnetoresistive element. The at least one magnetoresistive element includes a magnetization pinned layer having a magnetization in a predetermined direction, and a free layer having a magnetization whose direction is variable according to an applied magnetic field. In such a case, the detection value may vary according to an angle that the direction of the magnetization of the free layer forms with the direction of the magnetization of the magnetization pinned layer. The direction of the magnetization of the magnetization pinned layer may be parallel to the third direction.

The magnetic field detection unit may include a first portion and a second portion, the first portion and the second portion being located to be symmetric with respect to a central cross section, the central cross section being a cross section perpendicular to the second direction and passing through a center in the second direction of the at least one yoke.

The at least one magnetoresistive element may include a first magnetoresistive element included in the first portion of the magnetic field detection unit, and a second magnetoresistive element included in the second portion of the magnetic field detection unit. The first magnetoresistive element and the second magnetoresistive element are located to be symmetric with respect to the central cross section, and are connected to each other in series.

The first portion and the second portion may be mutually different portions of the at least one magnetoresistive element.

In the magnetic sensor of the present invention, the magnetic field detection unit may include a power supply port configured to receive a predetermined voltage, a ground port connected to a ground, an output port, a first resistor section provided between the power supply port and the output port, and a second resistor section provided between the output port and the ground port. Each of the first and second resistor sections may include a first portion and a second portion, the first portion and the second portion being located to be symmetric with respect to a central cross section, the central cross section being a cross section perpendicular to the second direction and passing through a center in the second direction of the at least one yoke.

Each of the first and second resistor sections may include at least one magnetoresistive element. The at least one magnetoresistive element includes a magnetization pinned layer having a magnetization in a predetermined direction, and a free layer having a magnetization whose direction is variable according to an applied magnetic field. In such a case, the detection value may depend on an electric potential at the output port.

In the magnetic sensor of the present invention, the magnetic field detection unit may include a power supply port configured to receive a predetermined voltage, a ground port connected to a ground, a first output port, a second output port, a first resistor section provided between the power supply port and the first output port, a second resistor section provided between the first output port and the ground port, a third resistor section provided between the power supply port and the second output port, and a fourth resistor section provided between the second output port and the ground port. Each of the first to fourth resistor sections may include a first portion and a second portion, the first portion and the second portion being located to be symmetric with respect to a central cross section, the central cross section being a cross section perpendicular to the second direction and passing through a center in the second direction of the at least one yoke.

Each of the first to fourth resistor sections may include at least one magnetoresistive element. The at least one magnetoresistive element includes a magnetization pinned layer having a magnetization in a predetermined direction, and a free layer having a magnetization whose direction is variable according to an applied magnetic field. In such a case, the detection value may depend on a potential difference between the first output port and the second output port.

In the magnetic sensor of the present invention, the input magnetic field may contain a magnetic field component in a direction parallel to the second direction, in addition to the input magnetic field component.

A magnetic sensor system of the present invention includes the magnetic sensor of the present invention, and a magnetic field generation unit for generating a predetermined magnetic field. The magnetic sensor and the magnetic field generation unit are configured so that a partial magnetic field is applied to the magnetic sensor, the partial magnetic field being part of the predetermined magnetic field. The partial magnetic field contains a first magnetic field component in a direction parallel to the first direction, and a second magnetic field component in a direction parallel to the second direction. The input magnetic field is the partial magnetic field. The input magnetic field component is the first magnetic field component.

In the magnetic sensor system of the present invention, the magnetic sensor and the magnetic field generation unit may be configured so that the first magnetic field component varies as the position of the magnetic field generation unit relative to the magnetic sensor varies.

According to the magnetic sensor and the magnetic sensor system of the present invention, the provision of the at least one shield serves to prevent the problem arising in the case where the input magnetic field contains not only the input magnetic field component but also a magnetic field component in a direction different from the direction of the input magnetic field component.

Other and further objects, features and advantages of the present invention will appear more fully from the following description.

DETAILED DESCRIPTION OF THE PREFERRED EMBODIMENTS

First Embodiment

Figure 1:
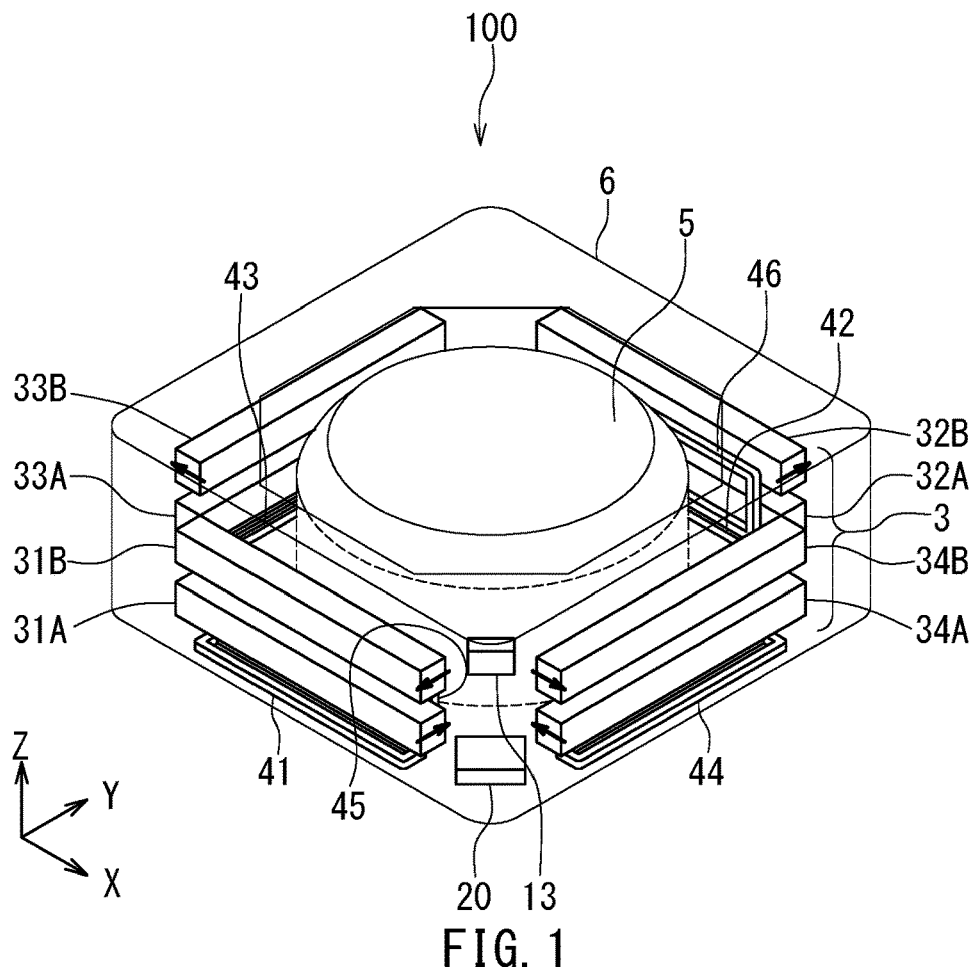
FIG. 1 is a perspective view of a camera module including a magnetic sensor system according to a first embodiment of the invention.
Figure 2:
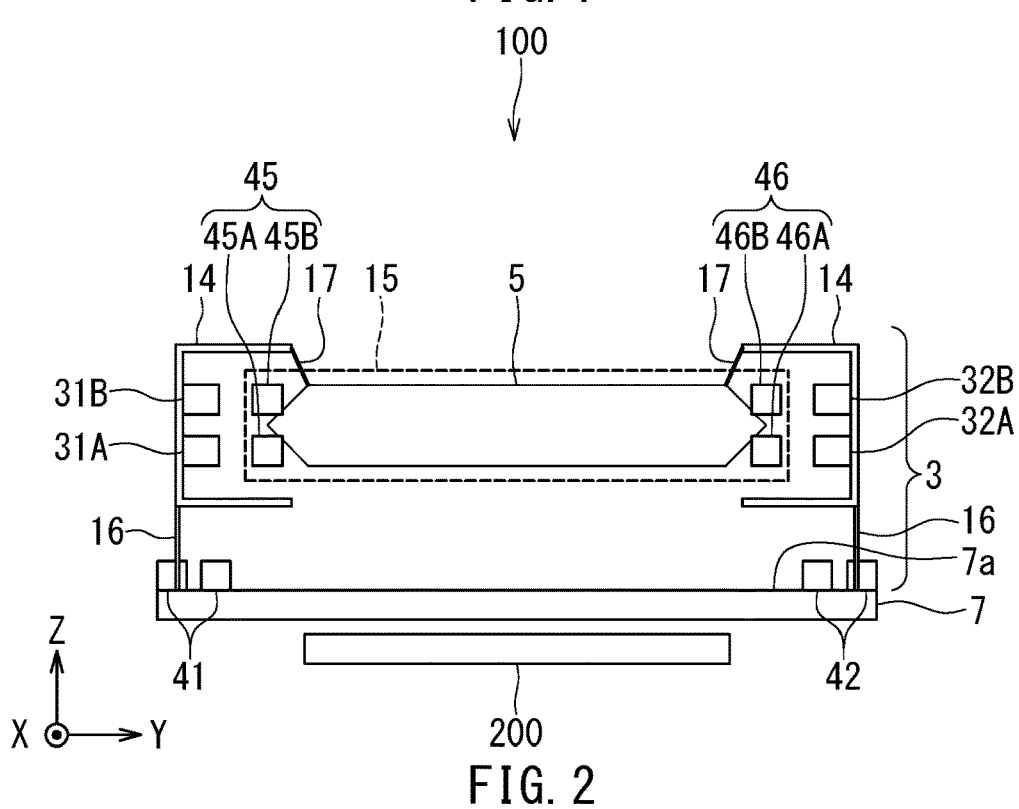
FIG. 2 illustrates an internal schematic view of the camera module of FIG. 1.

Preferred embodiments of the present invention will now be described in detail with reference to the drawings. First, reference is made to FIG. 1 and FIG. 2 to describe the configuration of a camera module including a magnetic sensor system according to a first embodiment of the invention. FIG. 1 is a perspective view of the camera module 100. FIG. 2 illustrates a schematic internal view of the camera module 100. For ease of understanding, in FIG. 2 the parts of the cameral module 100 are drawn on a different scale and in a different layout than those in FIG. 1. The camera module 100 constitutes, for example, a portion of a camera for a smartphone having an optical image stabilization mechanism and an autofocus mechanism, and is used in combination with an image sensor 200 that uses CMOS or other similar techniques.

The camera module 100 includes a driving device 3, a lens 5, a housing 6 and a substrate 7. The driving device 3 is to move the lens 5. The driving device 3 includes the magnetic sensor system according to the present embodiment. The magnetic sensor system will be described later. The housing 6 is to protect the driving device 3. The substrate 7 has a top surface 7a. FIG. 1 omits the illustration of the substrate 7, and FIG. 2 omits the illustration of the housing 6.

Now, we define X, Y, and Z directions as shown in FIGS. 1 and 2. The X, Y, and Z directions are orthogonal to one another. In the present embodiment, the Z direction is a direction perpendicular to the top surface 7a of the substrate 7. In FIG. 2 the Z direction is the upward direction. The X and Y directions are both parallel to the top surface 7a of the substrate 7. The opposite directions to the X, Y, and Z directions will be referred to as −X, −Y, and −Z directions, respectively. As used herein, the term "above" refers to positions located forward of a reference position in the Z direction, and "below" refers to positions located on a side of the reference position opposite from "above".

The lens 5 is disposed above the top surface 7a of the substrate 7 in such an orientation that the direction of its optical axis is parallel to the Z direction. The substrate 7 has an opening (not illustrated) for passing light that has passed through the lens 5. As shown in FIG. 2, the camera module 100 is in alignment with the image sensor 200 so that light that has passed through the lens 5 and the non-illustrated opening will enter the image sensor 200.

Figure 3:
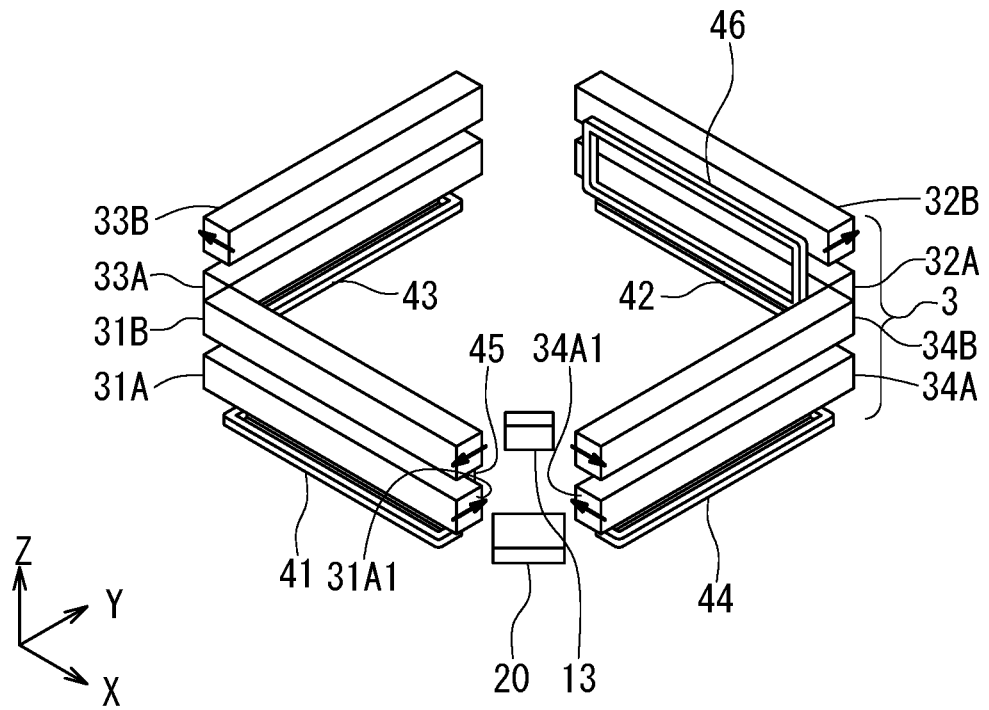
FIG. 3 is a perspective view of a driving device of the camera module of FIG. 1.
Figure 4:
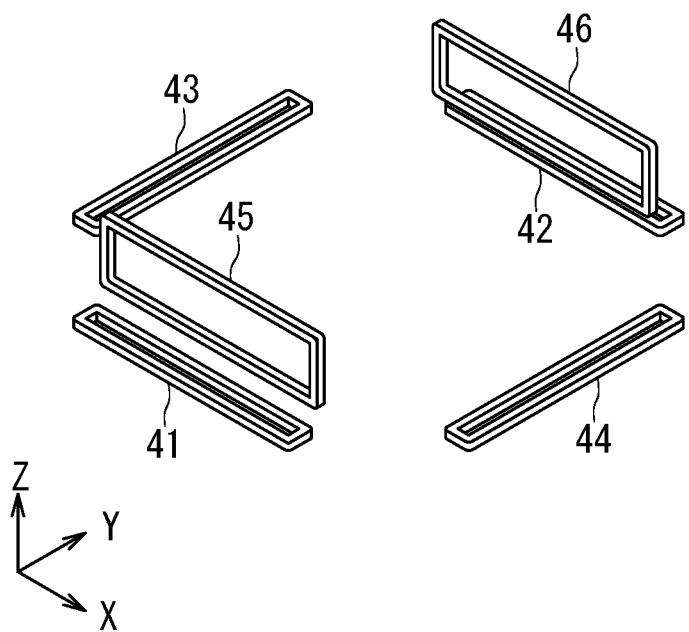
FIG. 4 is a perspective view of a plurality of coils of the driving device of FIG. 1.
Figure 5:
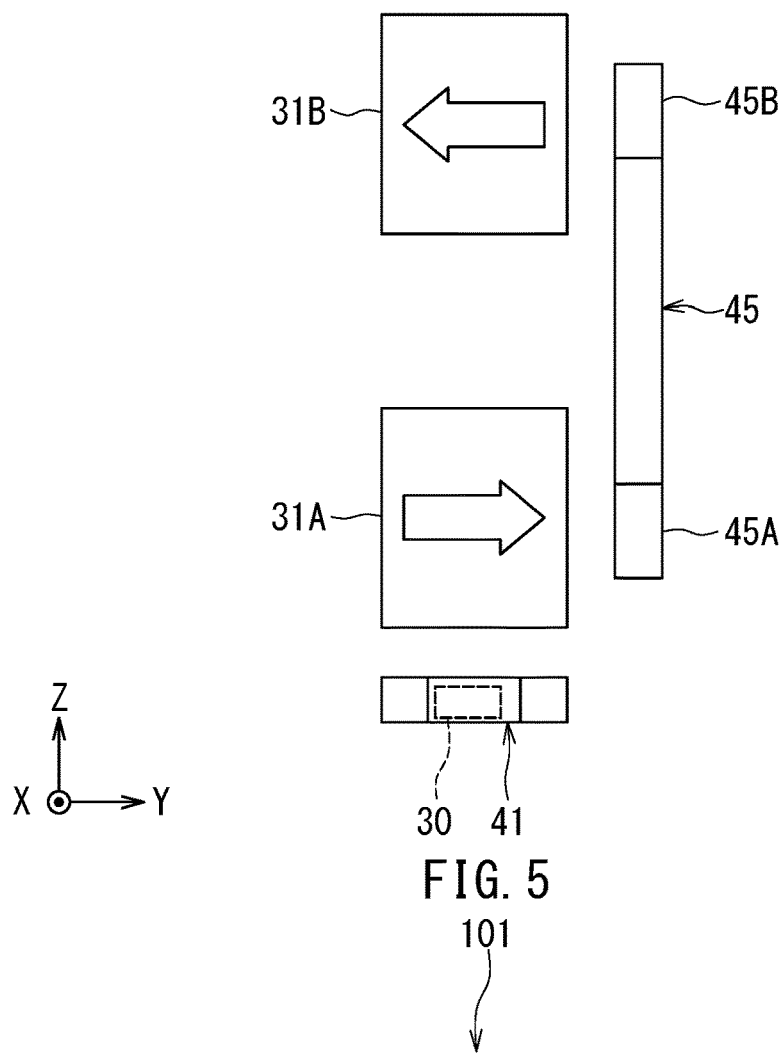
FIG. 5 is a side view illustrating the principal parts of the driving device of FIG. 1.

The driving device 3 will now be described in detail with reference to FIG. 2 to FIG. 5. FIG. 3 is a perspective view of the driving device 3. FIG. 4 is a perspective view of a plurality of coils of the driving device 3. FIG. 5 is a side view illustrating the principal parts of the driving device 3.

The driving device 3 includes a first holding member 14, a second holding member 15, a plurality of first wires 16, and a plurality of second wires 17. The second holding member 15 is to hold the lens 5. Although not illustrated, the second holding member 15 is shaped like a hollow cylinder so that the lens 5 is insertable in the hollow.

The second holding member 15 is provided such that its position is variable in one direction, specifically, in the direction of the optical axis of the lens 5, i.e., a direction parallel to the Z direction, relative to the first holding member 14. In the present embodiment, the first holding member 14 is shaped like a box so that the lens 5 and the second holding member 15 can be accommodated therein. The plurality of second wires 17 connect the first and second holding members 14 and 15 and support the second holding member 15 such that the second holding member 15 is movable relative to the first holding member 14 in a direction parallel to the Z direction.

The first holding member 14 is provided above the top surface 7a of the substrate 7 such that its position is variable relative to the substrate 7 in a direction parallel to the X direction and in a direction parallel to the Y direction. The plurality of first wires 16 connect the substrate 7 and the first holding member 14, and support the first holding member 14 such that the first holding member 14 is movable relative to the substrate 7 in a direction parallel to the X direction and in a direction parallel to the Y direction. When the position of the first holding member 14 relative to the substrate 7 varies, the position of the second holding member 15 relative to the substrate 7 also varies.

The driving device 3 further includes magnets 31A, 31B, 32A, 32B, 33A, 33B, 34A and 34B, and coils 41, 42, 43, 44, 45 and 46. The magnet 31A is located forward of the lens 5 in the −Y direction. The magnet 32A is located forward of the lens 5 in the Y direction. The magnet 33A is located forward of the lens 5 in the −X direction. The magnet 34A is located forward of the lens 5 in the X direction. The magnets 31B, 32B, 33B and 34B are located above the magnets 31A, 32A, 33A and 34A, respectively. The magnets 31A, 31B, 32A, 32B, 33A, 33B, 34A and 34B are fixed to the first holding member 14.

As shown in FIG. 3, the magnets 31A, 31B, 32A and 32B are each in the shape of a rectangular solid that is long in the X direction. The magnets 33A, 33B, 34A and 34B are each in the shape of a rectangular solid that is long in the Y direction. The magnets 31A and 32B are magnetized in the Y direction. The magnets 31B and 32A are magnetized in the −Y direction. The magnets 33A and 34B are magnetized in the X direction. The magnets 33B and 34A are magnetized in the −X direction. In FIGS. 1 and 3, the magnetization directions of he magnets 31A, 31B, 32B, 33B, 34A and 34B are indicated by the arrows drawn to overlap the respective magnets. In FIG. 5 the magnetization directions of the magnets 31A and 31B are indicated by the arrows drawn inside the magnets 31A and 31B.

The magnet 31A has an end face 31A1 located at the end in the X direction of the magnet 31A. The magnet 34A has an end face 34A1 located at the end in the −Y direction of the magnet 34A.

The coil 41 is located between the magnet 31A and the substrate 7. The coil 42 is located between the magnet 32A and the substrate 7. The coil 43 is located between the magnet 33A and the substrate 7. The coil 44 is located between the magnet 34A and the substrate 7. The coil 45 is located between the lens 5 and the magnets 31A and 31B. The coil 46 is located between the lens 5 and the magnets 32A and 32B. The coils 41, 42, 43 and 44 are fixed to the substrate 7. The coils 45 and 46 are fixed to the second holding member 15.

The coil 41 is subjected mainly to a magnetic field generated by the magnet 31A. The coil 42 is subjected mainly to a magnetic field generated by the magnet 32A. The coil 43 is subjected mainly to a magnetic field generated by the magnet 33A. The coil 44 is subjected mainly to a magnetic field generated by the magnet 34A.

As shown in FIGS. 2, 4 and 5, the coil 45 includes a first conductor portion 45A extending along the magnet 31A in the X direction, a second conductor portion 45B extending along the magnet 31B in the X direction, and two third conductor portions connecting the first and second conductor portions 45A and 45B. As shown in FIGS. 2 and 4, the coil 46 includes a first conductor portion 46A extending along the magnet 32A in the X direction, a second conductor portion 46B extending along the magnet 32B in the X direction, and two third conductor portions connecting the first and second conductor portions 46A and 46B.

The first conductor portion 45A of the coil 45 is subjected mainly to a component in the Y direction of the magnetic field generated by the magnet 31A. The second conductor portion 45B of the coil 45 is subjected mainly to a component in the −Y direction of a magnetic field generated by the magnet 31B. The first conductor portion 46A of the coil 46 is subjected mainly to a component in the −Y direction of the magnetic field generated by the magnet 32A. The second conductor portion 46B of the coil 46 is subjected mainly to a component in the Y direction of a magnetic field generated by the magnet 32B.

The driving device 3 further includes a magnetic sensor 30 disposed on the inner side of one of the coils 41 and 42 and fixed to the substrate 7, and a magnetic sensor 30 disposed on the inner side of one of the coils 43 and 44 and fixed to the substrate 7. Assume here that the two magnetic sensors 30 are disposed on the inner sides of the coils 41 and 44, respectively. As will be described later, the two magnetic sensors 30 are used to adjust the position of the lens 5 to reduce the effect of hand-induced camera shake.

The magnetic sensor 30 disposed on the inner side of the coil 41 detects the magnetic field generated by the magnet 31A and generates a detection value corresponding to the position of the magnet 31A. The magnetic sensor 30 disposed on the inner side of the coil 44 detects the magnetic field generated by the magnet 34A and generates a detection value corresponding to the position of the magnet 34A. The configuration of the magnetic sensors 30 will be described later.

The driving device 3 further includes a magnet 13 and a magnetic sensor 20. The magnetic sensor 20 is used to detect the position of the lens 5 during automatic focusing. The magnetic sensor 20 is fixed to the substrate 7 at a position near the end face 31A1 of the magnet 31A and the end face 34A1 of the magnet 34A. For example, the magnetic sensor 20 is constructed of elements for detecting magnetic fields, such as magnetoresistive elements.

The magnet 13 is disposed above the magnetic sensor 20 and fixed to the second holding member 15. The magnet 13 is in the shape of a rectangular solid. When the position of the second holding member 15 relative to the first holding member 14 varies in a direction parallel to the Z direction, the position of the magnet 13 relative to the first holding member 14 also varies in the direction parallel to the Z direction.

Reference is now made to FIG. 2 to FIG. 5 to describe the operation of the driving device 3. The driving device 3 constitutes part of optical image stabilization and autofocus mechanisms. Such mechanisms will be briefly described first. A control unit (not illustrated) external to the camera module 100 controls the driving device 3, the optical image stabilization mechanism and the autofocus mechanism.

The optical image stabilization mechanism is configured to detect hand-induced camera shake using, for example, a gyrosensor external to the camera module 100. Upon detection of hand-induced camera shake by the optical image stabilization mechanism, the non-illustrated control unit controls the driving device 3 so as to vary the position of the lens 5 relative to the substrate 7 depending on the mode of the camera shake. This stabilizes the absolute position of the lens 5 to reduce the effect of the camera shake. The position of the lens 5 relative to the substrate 7 is varied in a direction parallel to the X direction or parallel to the Y direction, depending on the mode of the camera shake.

The autofocus mechanism is configured to detect a state in which focus is achieved on the subject, using, for example, an image sensor 200 or an autofocus sensor. Using the driving device 3, the non-illustrated control unit varies the position of the lens 5 relative to the substrate 7 in a direction parallel to the Z direction so as to achieve focus on the subject. This enables automatic focusing on the subject.

Next, a description will be given of the operation of the driving device 3 related to the optical image stabilization mechanism. When currents are passed through the coils 41 and 42 by the non-illustrated control unit, the first holding member 14 with the magnets 31A and 32A fixed thereto moves in a direction parallel to the Y direction due to interaction between the magnetic fields generated by the magnets 31A and 32A and the magnetic fields generated by the coils 41 and 42. As a result, the lens 5 also moves in the direction parallel to the Y direction. On the other hand, when currents are passed through the coils 43 and 44 by the non-illustrated control unit, the first holding member 14 with the magnets 33A and 34A fixed thereto moves in a direction parallel to the X direction due to interaction between the magnetic fields generated by the magnets 33A and 34A and the magnetic fields generated by the coils 43 and 44. As a result, the lens 5 also moves in the direction parallel to the X direction. The non-illustrated control unit detects the position of the lens 5 by measuring signals corresponding to the positions of the magnets 31A and 34A, which are generated by the two magnetic sensors 30.

Next, the operation of the driving device 3 related to the autofocus mechanism will be described. To move the position of the lens 5 relative to the substrate 7 in the Z direction, the non-illustrated control unit passes a current through the coil 45 such that the current flows through the first conductor portion 45A in the X direction and flows through the second conductor portion 45B in the −X direction, and passes a current through the coil 46 such that the current flows through the first conductor portion 46A in the −X direction and flows through the second conductor portion 46B in the X direction. These currents and the magnetic fields generated by the magnets 31A, 31B, 32A and 32B cause a Lorentz force in the Z direction to be exerted on the first and second conductor portions 45A and 45B of the coil 45 and the first and second conductor portions 46A and 46B of the coil 46. This causes the second holding member 15 with the coils 45 and 46 fixed thereto to move in the Z direction. As a result, the lens 5 also moves in the Z direction.

To move the position of the lens 5 relative to the substrate 7 in the −Z direction, the non-illustrated control unit passes currents through the coils 45 and 46 in directions opposite to those in the case of moving the position of the lens 5 relative to the substrate 7 in the Z direction.

When the position of the lens 5 relative to the substrate 7 varies in a direction parallel to the Z direction, the position of the magnet 13 relative to the magnetic sensor 20 also varies in the direction parallel to the Z direction. The magnetic sensor 20 detects at least a magnetic field generated by the magnet 13, and generates a signal corresponding to the position of the magnet 13. The non-illustrated control unit detects the position of the lens 5 by measuring the signal generated by the magnetic sensor 20. A schematic configuration of the magnetic sensor system according to the present embodiment will now be described with reference to FIGS. 1 to 5. The magnetic sensor system according to the present embodiment includes a magnetic sensor according to the present embodiment, and a magnetic field generation unit for generating a predetermined magnetic field. In the present embodiment, the magnetic sensor 30 disposed on the inner side of the coil 41 or the magnetic sensor 30 disposed on the inner side of the coil 44 corresponds to the magnetic sensor according to the present embodiment. For the magnetic sensor system having the magnetic sensor 30 disposed on the inner side of the coil 41, the magnet 31A corresponds to the magnetic field generation unit. For the magnetic sensor system having the magnetic sensor 30 disposed on the inner side of the coil 44, the magnet 34A corresponds to the magnetic field generation unit.

Figure 6:
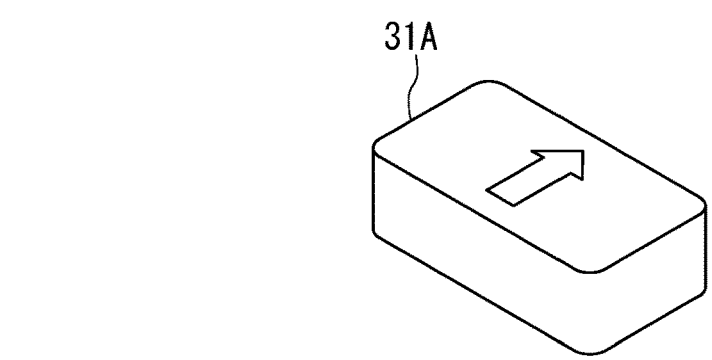
FIG. 6 is a perspective view illustrating the principal parts of the magnetic sensor system according to the first embodiment of the invention.
Figure 6:
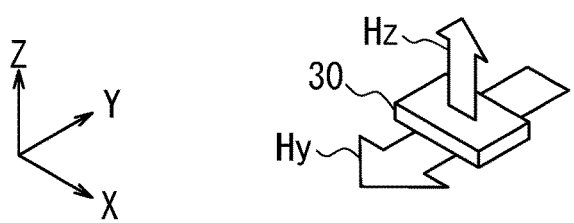

Reference is now made to FIG. 6 to describe the magnetic sensor system 101 having the magnetic sensor 30 disposed on the inner side of the coil 41. FIG. 6 is a perspective view illustrating the principal parts of the magnetic sensor system 101. For ease of understanding, in FIG. 6, the coil 41 is omitted and the magnet 31A is drawn on a different scale and in a different location than those in FIGS. 1 to 3 and 5. Hereinafter, unless otherwise specified, the magnetic sensor 30 disposed on the inner side of the coil 41 will be simply referred to as the magnetic sensor 30, and may also be referred to as the magnetic sensor 30 according to the present embodiment.

The magnetic sensor 30 and the magnetic field generation unit, i.e., the magnet 31A, are configured so that a partial magnetic field is applied to the magnetic sensor 30. The partial magnetic field is part of the magnetic field generated by the magnet 31A. The partial magnetic field contains a first magnetic field component Hz parallel to the Z direction and a second magnetic field component Hy parallel to the Y direction. The Z direction corresponds to the first direction in the present invention. The Y direction corresponds to the second direction in the present invention.

In the present embodiment, as shown in FIG. 6, the magnet 31A is magnetized in the Y direction, and the second magnetic field component Hy is in the −Y direction. In FIG. 6, the first magnetic field component Hz when the magnet 31A has moved in the Y direction from the position shown in FIG. 5 is shown.

As described previously, the magnetic sensor 30 is fixed to the substrate 7 and the magnet 31A is fixed to the first holding member 14 (see FIG. 2). When the position of the first holding member 14 relative to the substrate 7 varies in a direction parallel to the Y direction, the position of the magnet 31A relative to the magnetic sensor 30 also varies in the direction parallel to the Y direction. The detection value of the magnetic sensor 30 corresponds to the position of the magnet 31A relative to the magnetic sensor 30 in the direction parallel to the Y direction. Hereinafter, the position of the magnet 31A relative to the magnetic sensor 30 in the direction parallel to the Y direction will also be referred to as the detection-target position. The magnetic sensor system 101 is a position detection device for detecting the detection-target position.

The magnetic sensor 30 and the magnet 31A are also configured so that the first magnetic field component Hz varies as the detection-target position varies. In the present embodiment, the first magnetic field component Hz varies as the first holding member 14 moves in the direction parallel to the Y direction to vary the detection-target position.

Figure 7:
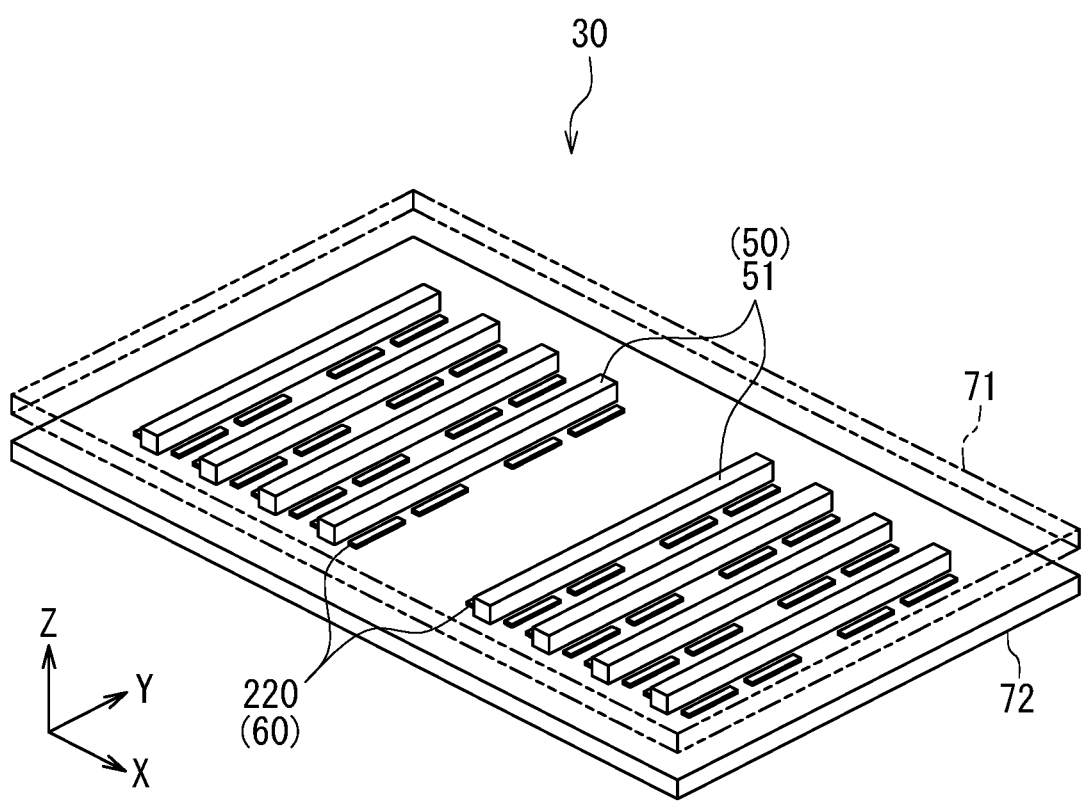
FIG. 7 is a perspective view of a magnetic sensor according to the first embodiment of the invention.
Figure 8:
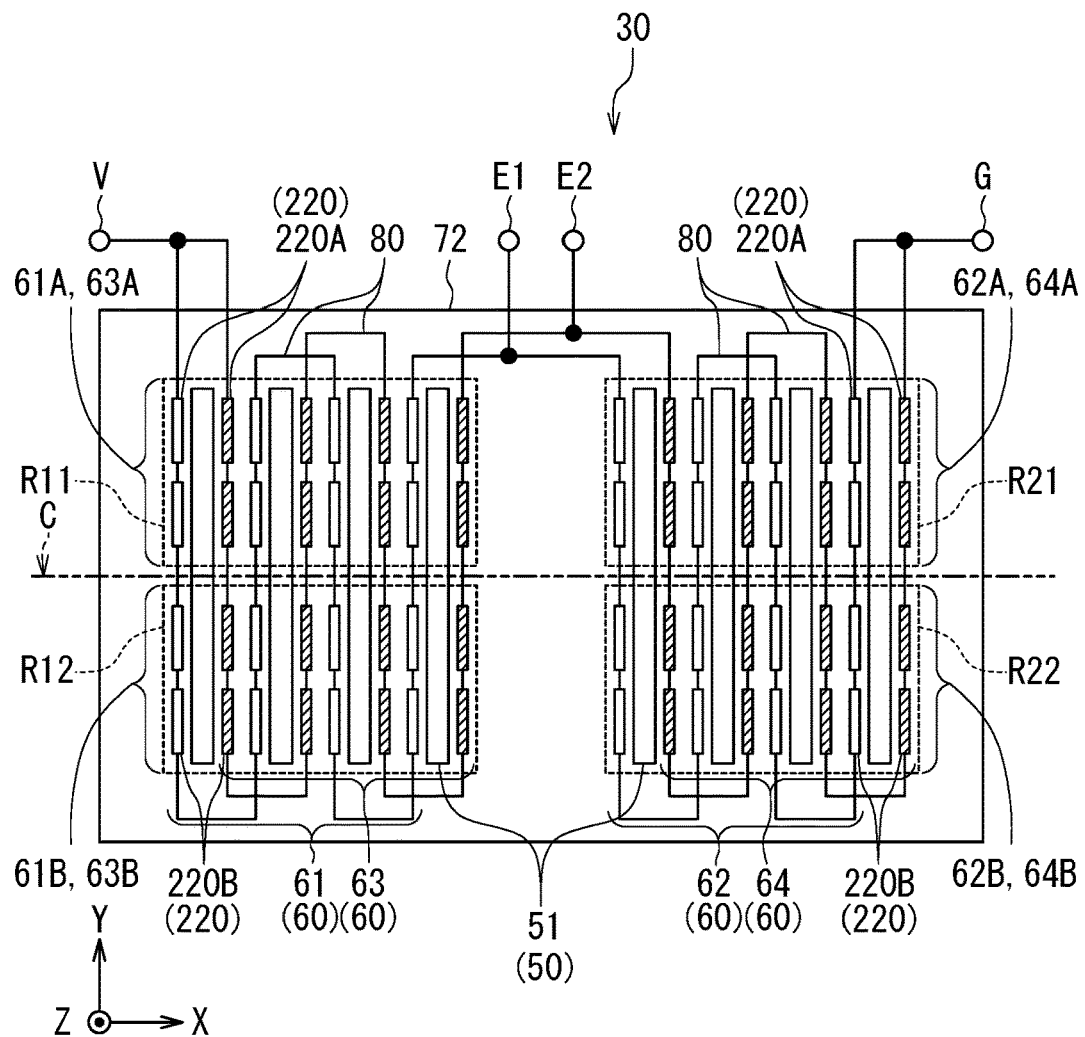
FIG. 8 is a plan view of the magnetic sensor according to the first embodiment of the invention.
Figure 9:
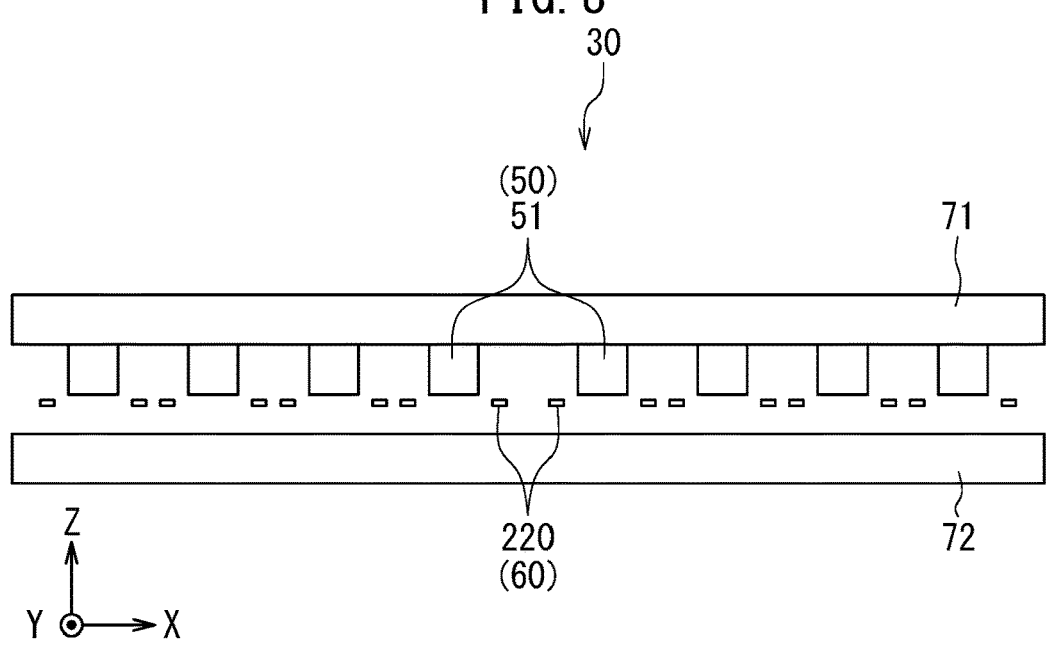
FIG. 9 is a side view of the magnetic sensor according to the first embodiment of the invention.

Now, the magnetic sensor 30 according to the present embodiment will be described with reference to FIGS. 7 to 9. FIG. 7 is a perspective view of the magnetic sensor 30. FIG. 8 is a plan view of the magnetic sensor 30. FIG. 9 is a side view of the magnetic sensor 30. The magnetic sensor 30 includes a magnetic field conversion unit 50 and a magnetic field detection unit 60.

The magnetic field conversion unit 50 includes at least one yoke formed of a soft magnetic material. When viewed in a direction parallel to the Z direction, e.g., when viewed from above, the at least one yoke has a shape that is long in the Y direction. The at least one yoke is configured to receive an input magnetic field and to output an output magnetic field. The input magnetic field contains an input magnetic field component in a direction parallel to the Z direction.

In the present embodiment, the input magnetic field is the foregoing partial magnetic field. The input magnetic field component is the foregoing first magnetic field component Hz (see FIG. 6). The output magnetic field contains an output magnetic field component in a direction parallel to the X direction. The output magnetic field component varies according to the input magnetic field component. i.e., the first magnetic field component Hz. The X direction corresponds to the third direction in the present invention. In the present embodiment, the first direction (the Z direction), the second direction (the Y direction), and the third direction (the X direction) are orthogonal to one another. The input magnetic field contains the second magnetic field component Hy, which is a magnetic field component in a direction parallel to the Y direction, in addition to the input magnetic field component (the first magnetic field component Hz).

In the present embodiment, as shown in FIGS. 7 and 8, the magnetic field conversion unit 50 includes a plurality of yokes 51 as the at least one yoke. The yokes 51 are aligned in the X direction. The yokes 51 are each in the shape of a rectangular solid that is long in the Y direction. The yokes 51 are identical in shape.

The magnetic field detection unit 60 is configured to receive the output magnetic field and to generate a detection value that varies according to the input magnetic field component (the first magnetic field component Hz) and the output magnetic field component. The magnetic field detection unit 60 includes at least one magnetoresistive (MR)

element 220. In the present embodiment, the magnetic field detection unit 60 includes a plurality of MR elements 220 as the at least one MR element 220.

As will be described in detail later, the plurality of MR elements 220 form a plurality of element trains. Each of the plurality of element trains is constituted of two or more MR elements 220 aligned in the Y direction. Two element trains are associated with one yoke 51. The two element trains are disposed near the end in the −Z direction of the yoke 51 and opposed to each other in the X direction, with the yoke 51 in between. In the example shown in FIGS. 7 and 8, there are eight yokes 51 and sixteen element trains. Each element train is constituted of four MR elements 220.

As shown in FIG. 8, the magnetic field detection unit 60 further includes a first resistor section 61, a second resistor section 62, a third resistor section 63, and a fourth resistor section 64. Each of the first to fourth resistor sections 61 to 64 includes at least one MR element 220. The configuration of the first to fourth resistor sections 61 to 64 will be described in detail later.

The magnetic sensor 30 further includes at least one shield formed of a soft magnetic material. When viewed in a direction parallel to the Z direction, e.g., when viewed from above, the at least one shield has such a shape that its maximum dimension in the Y direction is smaller than its maximum dimension in the X direction. In the present embodiment, as shown in FIGS. 7 to 9, the magnetic sensor 30 includes a shield 71 and a shield 72 as the at least one shield. The shield 71 is located above the magnetic field conversion unit 50 and the magnetic field detection unit 60. The shield 72 is located below the magnetic field conversion unit 50 and the magnetic field detection unit 60. FIG. 8 omits the illustration of the shield 71. The shields 71 and 72 are each plate-shaped. When viewed in a direction parallel to the Z direction, e.g., when viewed from above, the shields 71 and 72 are rectangular and long in the X direction.

When viewed in a direction parallel to the Z direction, e.g., when viewed from above, the shields 71 and 72 are located to overlap the magnetic field conversion unit 50 and the magnetic field detection unit 60. When viewed from above, the magnetic field conversion unit 50 and the magnetic field detection unit 60 are located inside the perimeter of the shields 71 and 72. As shown in FIG. 9, the shield 71 may be in contact with the plurality of yokes 51 of the magnetic field conversion unit 50.

Here, a region that coincides with the shield 72 when viewed from above will be referred to as a shield projection region. Of the shield projection region, a portion from the center in the X direction to the end in the −X direction will be referred to as a left region, and a portion from the center in the X direction to the end in the X direction will be referred to as a right region.

In the example shown in FIGS. 7 and 8, four of the eight yokes 51 are located in the left region, and the remaining four yokes 51 are located in the right region.

In the present embodiment, the input magnetic field contains the second magnetic field component Hy in addition to the input magnetic field component (the first magnetic field component Hz). The second magnetic field component is a magnetic field component in a direction different from the direction of the input magnetic field component. A main role of the shields 71 and 72 is to absorb magnetic fluxes corresponding to the second magnetic field component Hy and reduce the strength of a magnetic field in a direction parallel to the Y direction, which results from the second magnetic field component Hy and is applied to the magnetic field detection unit 60.

The shields 71 and 72 are formed of a soft magnetic material. An example of the soft magnetic material is NiFe. When employing NiFe to form the shields 71 and 72, it is preferable to use NiFe having a composition that reduces the coefficient of thermal expansion, more specifically, a composition in which the percentage of Ni is 35% to 60% by weight, so as to reduce thermal stress of the shields 71 and 72. Further, in consideration of magnetic properties of the shields 71 and 72, it is more preferable to use NiFe having a composition in which the percentage of Ni is 40% to 60% by weight.

One of performance requirements for the shields 71 and 72 is a high maximum absorption of magnetic flux. The maximum absorption of magnetic flux of each of the shields 71 and 72 is approximately proportional to the product of the saturation magnetization and thickness (dimension in the Z direction) of the shield. To ensure the performance for each of the shields 71 and 72, the product of the saturation magnetization and thickness, i.e., the magnetic moment per unit area of each shield is preferably higher than or equal to 0.6 emu/cm$^2$.

The magnetic sensor 30 further includes a wiring section 80 for electrically connecting the plurality of MR elements 220. FIGS. 7 and 8 omit the illustration of the wiring section 80.

Although not illustrated, the magnetic sensor 30 further includes a sensor substrate and an insulating section. The shield 71 is disposed on the sensor substrate. The insulating section is formed of an insulating material and covers the shields 71 and 72, the MR elements 220 and the wiring section 80.

Figure 10:
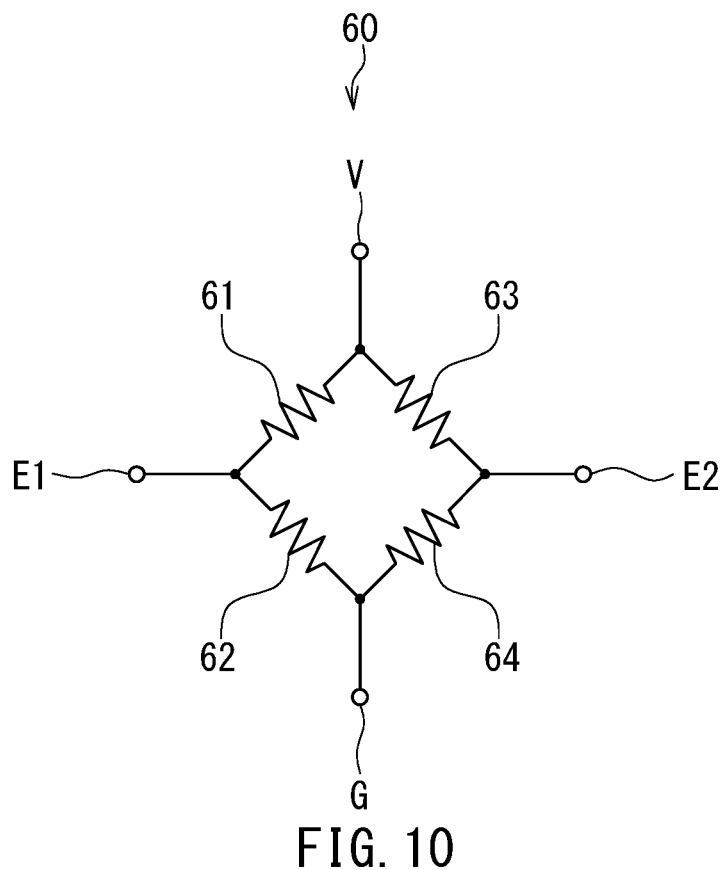
FIG. 10 is a circuit diagram illustrating the circuit configuration of a magnetic field detection unit of the first embodiment of the invention.

Reference is now made to FIGS. 8 to 10 to describe the circuit configuration of the magnetic field detection unit 60. FIG. 10 is a circuit diagram illustrating the circuit configuration of the magnetic field detection unit 60. The magnetic field detection unit 60 further includes a power supply port V configured to receive a predetermined voltage, a ground port G connected to the ground, a first output port E1, and a second output port E2. The first resistor section 61 is provided between the power supply port V and the first output port E1. The second resistor section 62 is provided between the first output port E1 and the ground port G The third resistor section 63 is provided between the power supply port V and the second output port E2. The fourth resistor section 64 is provided between the second output port E2 and the ground port G The magnetic field detection unit 60 generates a detection value that depends on a potential difference between the first output port E1 and the second output port E2.

The configuration of the first to fourth resistor sections 61 to 64 will now be described in detail with reference to FIG. 8. In the present embodiment, each of the first to fourth resistor sections 61 to 64 includes a plurality of MR elements 220. The MR elements 220 included in the first and third resistor sections 61 and 63 are located in the left region. The MR elements 220 included in the second and fourth resistor sections 62 and 64 are located in the right region. In FIG. 8, the MR elements 220 included in the third resistor section 63 and the MR elements 220 included in the fourth resistor section 64 are hatched.

In the example shown in FIG. 8, each of the first to fourth resistor sections 61 to 64 includes four element trains. Hereinafter, the element trains included in the first resistor section 61 will be referred to as the first element trains; the element trains included in the second resistor section 62 will be referred to as the second element trains; the element trains included in the third resistor section 63 will be referred to as the third element trains; and the element trains included in the fourth resistor section 64 will be referred to as the fourth element trains.

The four first element trains and the four third element trains are associated with the four yokes 51 located in the left region. One first element train associated with one yoke 51 is located on the −X side of the yoke 51. One third element train associated with one yoke 51 is located on the X side of the yoke 51.

The four second element trains and the four fourth element trains are associated with the four yokes 51 located in the right region. One second element train associated with one yoke 51 is located on the −X side of the yoke 51. One fourth element train associated with one yoke 51 is located on the X side of the yoke 51.

The first resistor section 61 includes a first portion 61A and a second portion 61B. The second resistor section 62 includes a first portion 62A and a second portion 62B. The third resistor section 63 includes a first portion 63A and a second portion 63B. The fourth resistor section 64 includes a first portion 64A and a second portion 64B. The magnetic field detection unit 60 thus includes four first portions and four second portions of the resistor sections 61 to 64.

The left region includes a region R11 and a region R12. Relative to the center in the Y direction of the left region, the region R11 is located forward in the Y direction, and the region R12 is located forward in the −Y direction. The right region includes a region R21 and a region R22. Relative to the center in the Y direction of the right region, the region R21 is located forward in the Y direction, and the region R22 is located forward in the −Y direction.

The first portion 61A of the first resistor section 61 and the first portion 63A of the third resistor section 63 are included in the region R11. The second portion 61B of the first resistor section 61 and the second portion 63B of the third resistor section 63 are included in the region R12. The first portion 62A of the second resistor section 62 and the first portion 64A of the fourth resistor section 64 are included in the region R21. The second portion 62B of the second resistor section 62 and the second portion 64B of the fourth resistor section 64 are included in the region R22.

In each of the first to fourth resistor sections 61 to 64, the first portion and the second portion are located to be symmetric with respect to a central cross section C. The central cross section C is a cross section perpendicular to the Y direction and passing through the center in the Y direction of at least one yoke 51. In the example shown in FIG. 8, the central cross section C passes through the centers of all the yokes 51.

Here, a first MR element 220A and a second MR element 220B are defined as follows. The first MR element 220A is an MR element 220 included in the first portion. The second MR element 220B is an MR element 220 included in the second portion. The first MR element 220A and the second MR element 220B are located to be symmetric with respect to the central cross section C, and are connected in series.

In the example shown in FIG. 8, one element train includes two pairs of first and second MR elements 220A and 220B. The four MR elements 220 constituting the two pairs of first and second MR elements 220A and 220B are connected in series.

Figure 11:
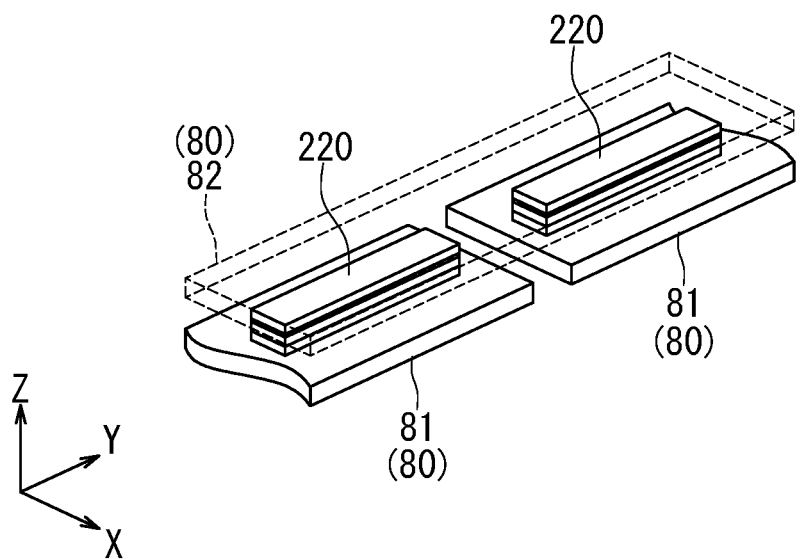
FIG. 11 is a perspective view illustrating part of a wiring section and magnetoresistive elements of the first embodiment of the invention.

Next, the wiring section 80 will be described with reference to FIG. 11. FIG. 11 is a perspective view illustrating part of the wiring section 80 and MR elements 220. The wiring section 80 includes a plurality of upper electrodes 82 and a plurality of lower electrodes 81. The MR elements 220 are disposed on the lower electrodes 81. The upper electrodes 82 are disposed on the MR elements 220.

The MR elements 220, the upper electrodes 82, and the lower electrodes 81 are connected in the following relationship. Each of the lower electrodes 81 is shaped to be narrow and long in the Y direction. Every two lower electrodes 81 that are adjacent to each other in the Y direction have a gap therebetween. MR elements 220 are provided on the top surfaces of the lower electrodes 81 at positions near opposite ends in the Y direction. Each of the upper electrodes 82 electrically connects two adjacent MR elements 220 that are disposed on two lower electrodes 81 adjacent in the Y direction. In such a manner, the plurality of MR elements 220 are connected in series.

The wiring section 80 further includes a plurality of connection electrodes. In each of the first to fourth resistor sections 61 to 64, the connection electrodes electrically connect the lower electrodes 81 so that the plurality of element trains are connected in series.

Figure 12:
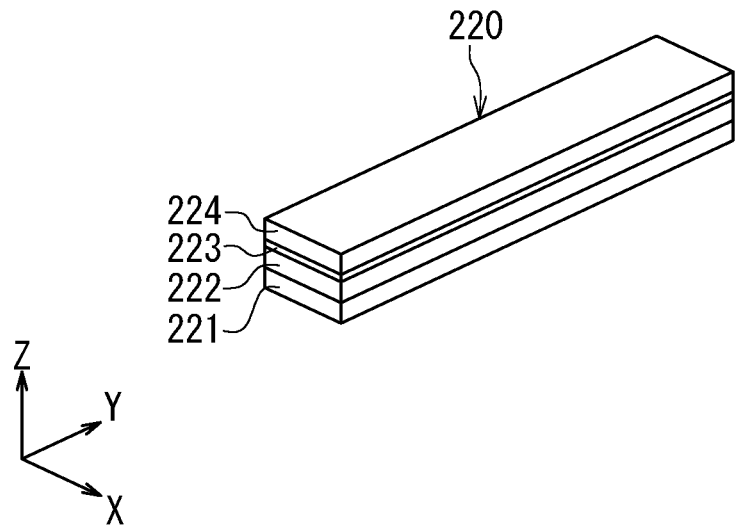
FIG. 12 is a perspective view of the magnetoresistive element of the first embodiment of the invention.

An example of configuration of the MR element 220 will now be described with reference to FIGS. 8 and 12. FIG. 12 is a perspective view of the MR element 220. In this example, the MR element 220 includes: a magnetization pinned layer 222 having a magnetization in a predetermined direction; a free layer 224 having a magnetization whose direction is variable according to an applied magnetic field; a gap layer 223 disposed between the magnetization pinned layer 222 and the free layer 224; and an antiferromagnetic layer 221. The antiferromagnetic layer 221, the magnetization pinned layer 222, the gap layer 223, and the free layer 224 are stacked in this order in the direction from the lower electrode 81. The antiferromagnetic layer 221 is formed of an antiferromagnetic material, and is in exchange coupling with the magnetization pinned layer 222 so as to fix the magnetization direction of the magnetization pinned layer 222.

The MR element 220 may be a tunneling magnetoresistive (TMR) element or a giant magnetoresistive (GMR) element of the current-perpendicular-to-plane (CPP) type in which a sense current for use in magnetic signal detection is fed in a direction substantially perpendicular to the plane of the layers constituting the MR element 220. In the TMR element, the gap layer 223 is a tunnel barrier layer. In the GMR element, the gap layer 223 is a nonmagnetic conductive layer.

The MR element 220 varies in resistance according to the angle that the direction of the magnetization of the free layer 224 forms with the direction of the magnetization of the magnetization pinned layer 222, and has a minimum resistance when the foregoing angle is 0° and a maximum resistance when the foregoing angle is 180°.

In the present embodiment, the direction of the magnetization of the magnetization pinned layer 222 is parallel to the X direction. In the present embodiment, the magnetizations of the magnetization pinned layers 222 of the MR elements 220 in the first resistor section 61 are in the opposite direction to the magnetizations of the magnetization pinned layers 222 of the MR elements 220 in the second resistor section 62. The magnetizations of the magnetization pinned layers 222 of the MR elements 220 in the third resistor section 63 are in the same direction as the magnetizations of the magnetization pinned layers 222 of the MR elements 220 in the first resistor section 61. The magnetizations of the magnetization pinned layers 222 of the MR elements 220 in the fourth resistor section 64 are in the same direction as the magnetizations of the magnetization pinned layers 222 of the MR elements 220 in the second resistor section 62.

In the present embodiment, specifically, the magnetizations of the magnetization pinned layers 222 of the MR elements 220 in the first and third resistor sections 61 and 63 are in the X direction. The magnetizations of the magnetization pinned layers 222 of the MR elements 220 in the second and fourth resistor sections 62 and 64 are in the −X direction.

In the present embodiment, each MR element 220 is shaped to be narrow and long in a direction parallel to the Y direction. The free layer 224 of each MR elements 220 thus has shape anisotropy such that the direction of the easy axis of magnetization is parallel to the Y direction. Thus, when there is no applied magnetic field, the direction of the magnetization of the free layer 224 is parallel to the Y direction. In the presence of the output magnetic field component, the direction of the magnetization of the free layer 224 varies according to the direction and strength of the output magnetic field component. The angle that the direction of the magnetization of the free layer 224 forms with the direction of the magnetization of the magnetization pinned layer 222 thus varies according to the direction and strength of the output magnetic field component received by each MR element 220. The resistance of each MR element 220 thus corresponds to the output magnetic field component.

In the present embodiment, the direction of the output magnetic field component received by the MR elements 220 in the second resistor section 62 is the same as the direction of the output magnetic field component received by the MR elements 220 in the first resistor section 61. On the other hand, the direction of the output magnetic field component received by the MR elements 220 in the third resistor section 63 and that of the output magnetic field component received by the MR elements 220 in the fourth resistor section 64 are opposite to the direction of the output magnetic field component received by the MR elements 220 in the first resistor section 61.

It should be appreciated that the configuration of the MR the element 220 described above with reference to FIG. 12 is exemplary and non-limiting. For example, the MR element 220 may be configured without the antiferromagnetic layer 151. In such a configuration, for example, a magnetization pinned layer of an artificial antiferromagnetic structure, which includes two ferromagnetic layers and a nonmagnetic metal layer interposed between the two ferromagnetic layers, may be provided in place of the antiferromagnetic layer 221 and the magnetization pinned layer 222.

The operations and effects of the magnetic sensor 30 and the magnetic sensor system 101 according to the present embodiment will now be described. The operation of the magnetic field detection unit 60 will be described first. Assume here that the input magnetic field consists only of the input magnetic field component. When there is no input magnetic field component and, as a result, no output magnetic field component, the direction of the magnetization of the free layer 224 of each MR element 220 is parallel to the Y direction. When there exists the input magnetic field component in the Z direction, the output magnetic field components received by the MR elements 220 in the first and second resistor sections 61 and 62 are in the X direction, and the output magnetic field components received by the MR elements 220 in the third and fourth resistor sections 63 and 64 are in the −X direction. In such a case, the magnetization direction of the free layers 224 of the MR elements 220 in the first and second resistor sections 61 and 62 tilts toward the X direction from the direction parallel to the Y direction, and the magnetization direction of the free layers 224 of the MR elements 220 in the third and fourth resistor sections 63 and 64 tilts toward the −X direction from the direction parallel to the Y direction. As a result, relative to the state where there is no output magnetic field component, the resistances of the MR elements 220 in the first and fourth resistor sections 61 and 64 decrease, and the resistances of the first and fourth resistor sections 61 and 64 also decrease. On the other hand, relative to the state where there is no output magnetic field component, the resistances of the MR elements 220 in the second and third resistor sections 62 and 63 increase, and the resistances of the second and third resistor sections 62 and 63 also increase.

When the input magnetic field component is in the −Z direction, the direction of the output magnetic field component and the changes in the resistances of the first to fourth resistor sections 61 to 64 become opposite from those in the above-described case where the input magnetic field component is in the Z direction.

The amount of change in the resistance of each MR element 220 depends on the strength of the output magnetic field component received by the MR element 220. The resistance of the MR element 20 increases or decreases by a larger amount as the strength of the output magnetic field component increases. The resistance of the MR element 20 increases or decreases by a smaller amount as the strength of the output magnetic field component decreases. The strength of the output magnetic field component depends on the strength of the input magnetic field component.

As described above, changes in the direction and strength of the input magnetic field component cause the first to fourth resistor sections 61 to 64 to change in resistance such that the resistances of the first and fourth resistor sections 61 and 64 increase while the resistances of the second and third resistor sections 62 and 63 decrease, or such that the resistances of the first and fourth resistor sections 61 and 64 decrease while the resistances of the second and third resistor sections 62 and 63 increase. This causes a change in the potential difference between the first output port E1 and the second output port E2 shown in FIGS. 8 and 10. The magnetic field detection unit 60 generates a detection value that depends on the potential difference between the first output port E1 and the second output port E2. The detection value varies according to the angle that the direction of the magnetization of the free layer 224 forms with the direction of the magnetization of the magnetization pinned layer 222.

Figure 13:
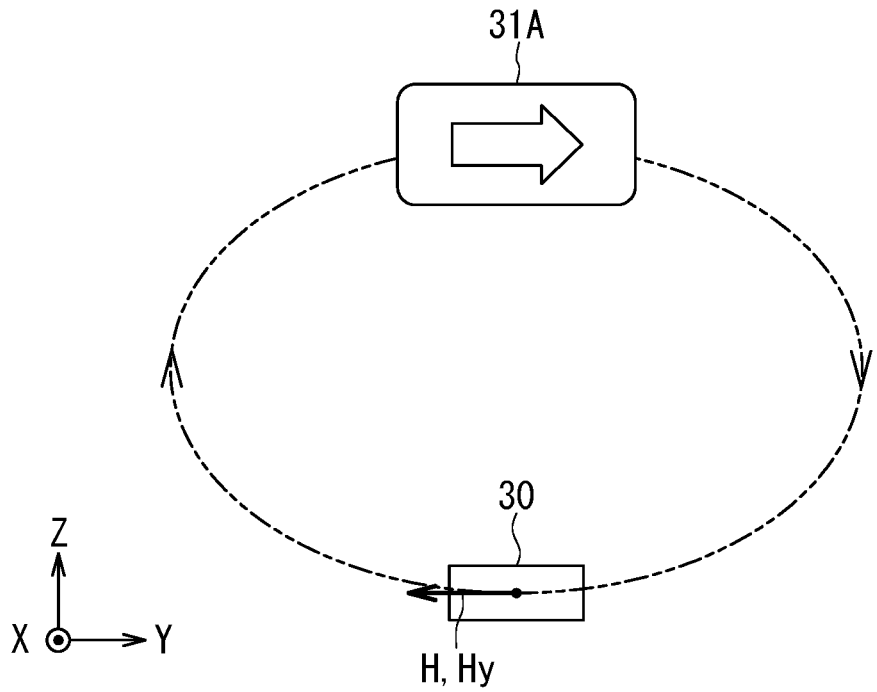
FIG. 13 is an explanatory diagram for describing the relationship between a detection-target position and an input magnetic field in the first embodiment of the invention.
Figure 14:
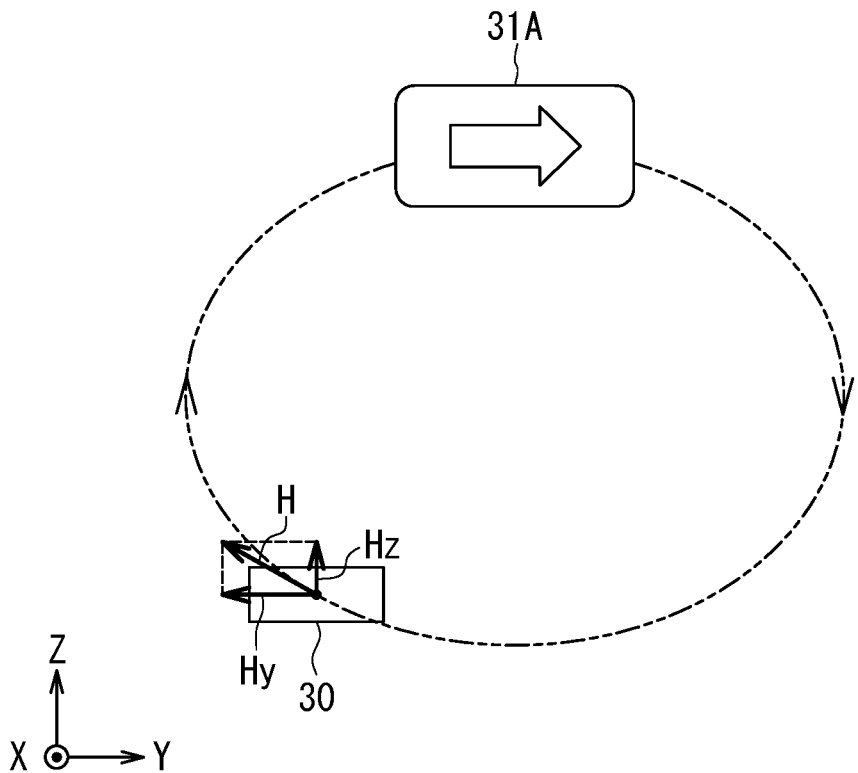
FIG. 14 is an explanatory diagram for describing the relationship between the detection-target position and the input magnetic field in the first embodiment of the invention.
Figure 15:
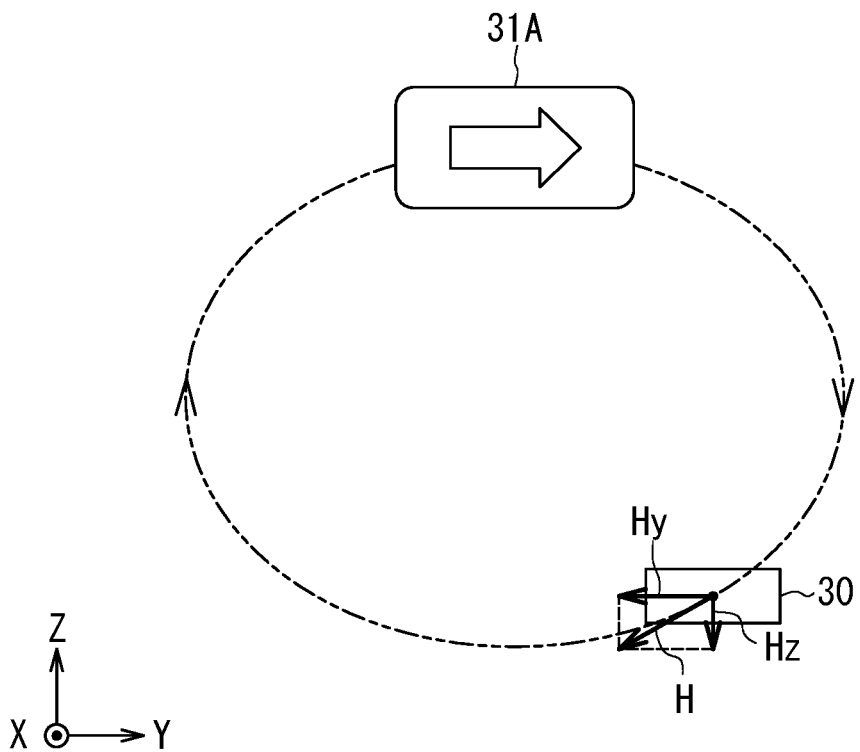
FIG. 15 is an explanatory diagram for describing the relationship between the detection-target position and the input magnetic field in the first embodiment of the invention.

Reference is now made to FIGS. 13 to 15 to describe the relationship between the detection-target position and the input magnetic field. FIGS. 13 to 15 illustrate the relationship between the detection-target position and the input magnetic field. In FIGS. 13 to 15, the arrow H represents the partial magnetic field applied to the magnetic sensor 30, i.e., the input magnetic field. The arrow Hz represents the first magnetic field component Hz, i.e., the input magnetic field component, and the arrow Hy represents the second magnetic field component Hy.

FIG. 13 shows a state in which the position of the magnet 31A in the Y direction coincides with that of the magnetic sensor 30 in the Y direction. FIG. 14 shows a state in which the magnet 31A is moved in the Y direction from the position shown in FIG. 13. FIG. 15 shows a state in which the magnet 31A is moved in the −Y direction from the position shown in FIG. 13. The first magnetic field component Hz or the input magnetic field component varies as the detection-target position or the position of the magnet 31A relative to the magnetic sensor 30 in a direction parallel to the Y direction varies as shown in FIGS. 13 to 15.

Figure 16:
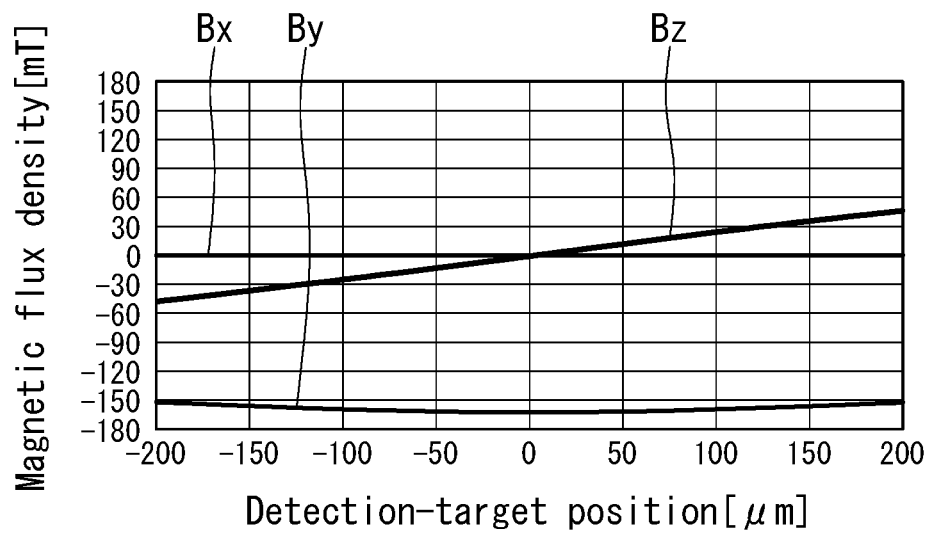
FIG. 16 is a characteristic diagram illustrating the relationship between the detection-target position and three directions of the input magnetic field in the first embodiment of the invention.

Now, the relationship between the detection-target position and the first and second magnetic field components Hz and Hy will be described. FIG. 16 is a characteristic diagram illustrating the relationship between the detection-target position and magnetic flux densities corresponding to the first and second magnetic field components Hz and Hy. In FIG. 16, the horizontal axis represents the detection-target position, and the vertical axis represents the magnetic flux density. In FIG. 16, the detection-target position of zero indicates that the position of the magnet 31A in the Y direction coincides with the position of the magnetic sensor 30 in the Y direction. The detection-target position is expressed in positive values as the magnet 31A moves in the Y direction from the zero position, and in negative values as the magnet 31A moves in the −Y direction from the zero position.

In FIG. 16, the curve Bz represents a magnetic flux density corresponding to the first magnetic field component Hz, and the curve By represents a magnetic flux density corresponding to the second magnetic field component Hy. FIG. 16 also shows a magnetic flux density Bx corresponding to a component of the partial magnetic field parallel to the X direction. The magnitude of the magnetic flux density Bx is substantially 0 regardless of the detection-target position.

In FIG. 16, a magnetic flux density Bz when the first magnetic field component Hz is in the Z direction is expressed in a positive value, and a magnetic flux density Bz when the first magnetic field component Hz is in the −Z direction is expressed in a negative value. The magnetic flux density Bz is approximately proportional to the value of the detection-target position.

In FIG. 16, a magnetic flux density By when the second magnetic field component Hy is in the −Y direction is expressed in a negative value. The magnetic flux density By is larger in absolute value than the magnetic flux density Bz.

The above description of the operation of the magnetic field detection unit 60 has been made on the assumption that the input magnetic field consists only of the input magnetic field component, i.e., the first magnetic field component Hz. However, in the magnetic sensor system 101 according to the present embodiment, the input magnetic field contains the second magnetic field component Hy in addition to the input magnetic field component, as can be seen from FIGS. 13 to 16.

When the second magnetic field component Hy is applied to the magnetic field detection unit 60, the free layer 224 of each MR element 220 is subjected not only to the output magnetic field component in a direction parallel to the X direction but also to the second magnetic field component Hy in a direction parallel to the Y direction. In such a case, the angle that the magnetization direction of the free layer 244 forms with the magnetization direction of the magnetization pinned layer 222 becomes different, and accordingly the detection value of the magnetic field detection unit 60 also becomes different, from those in the case where the input magnetic field consists only of the input magnetic field component. The second magnetic field component Hy can thus cause an error in the detection value of the magnetic field detection unit 60 and a drop in the sensitivity of the magnetic field detection unit 60.

According to the present embodiment, the shields 71 and 72 absorb magnetic flux corresponding to the second magnetic field component Hy to reduce the strength of a magnetic field in a direction parallel to the Y direction that would be applied to the magnetic field detection unit 60 due to the second magnetic field component Hy.

The present embodiment can thus prevent the problems arising in the case where the input magnetic field applied to the magnetic sensor 30 contains not only the input magnetic field component but also the second magnetic field component Hy, which is a magnetic field component in a direction different from the direction of the input magnetic field component.

Next, the effect of the shapes and arrangement of the plurality of yokes 51 and the shields 71 and 72 in the present embodiment will be described with comparison to a comparative example.

In the present embodiment, when viewed from above, each of the yokes 51 has a shape that is long in the Y direction, and each of the shields 71 and 72 has such a shape that its maximum dimension in the Y direction is smaller than its maximum dimension in the X direction. In other words, when viewed from above, the yokes 51 are oriented with their longitudinal direction in parallel to the Y direction, whereas the shields 71 and 72 are oriented with their longitudinal direction in parallel to the X direction.

Figure 17:
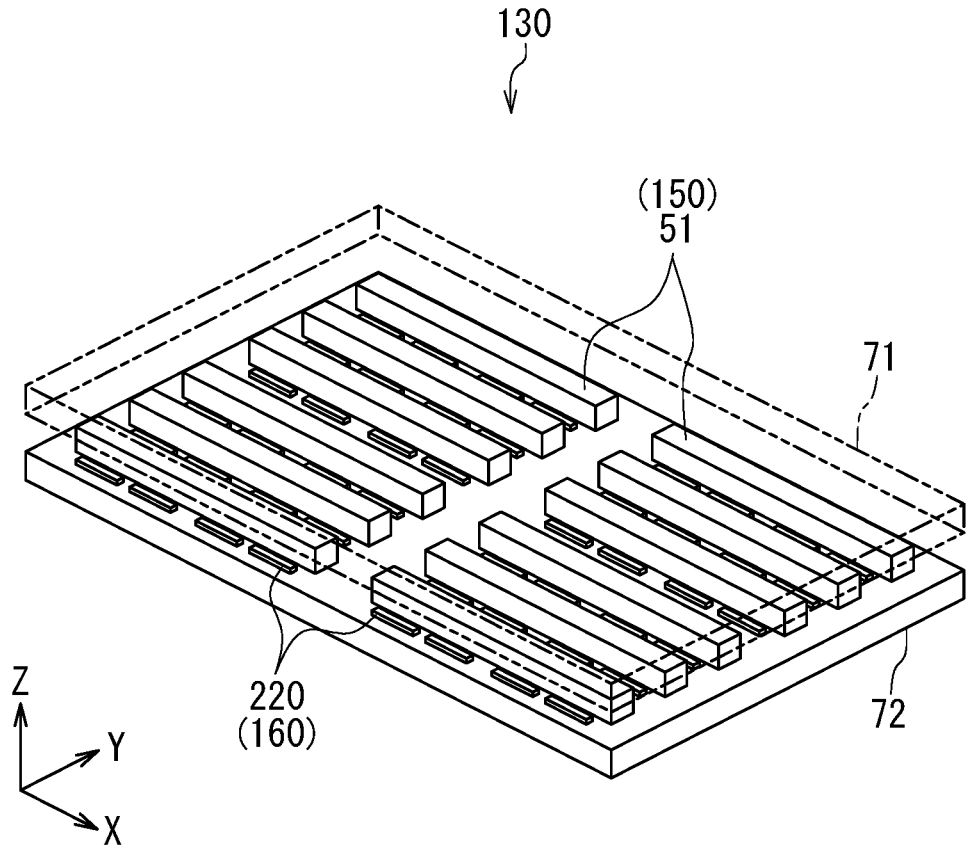
FIG. 17 is a perspective view of a magnetic sensor of a comparative example.
Figure 18:
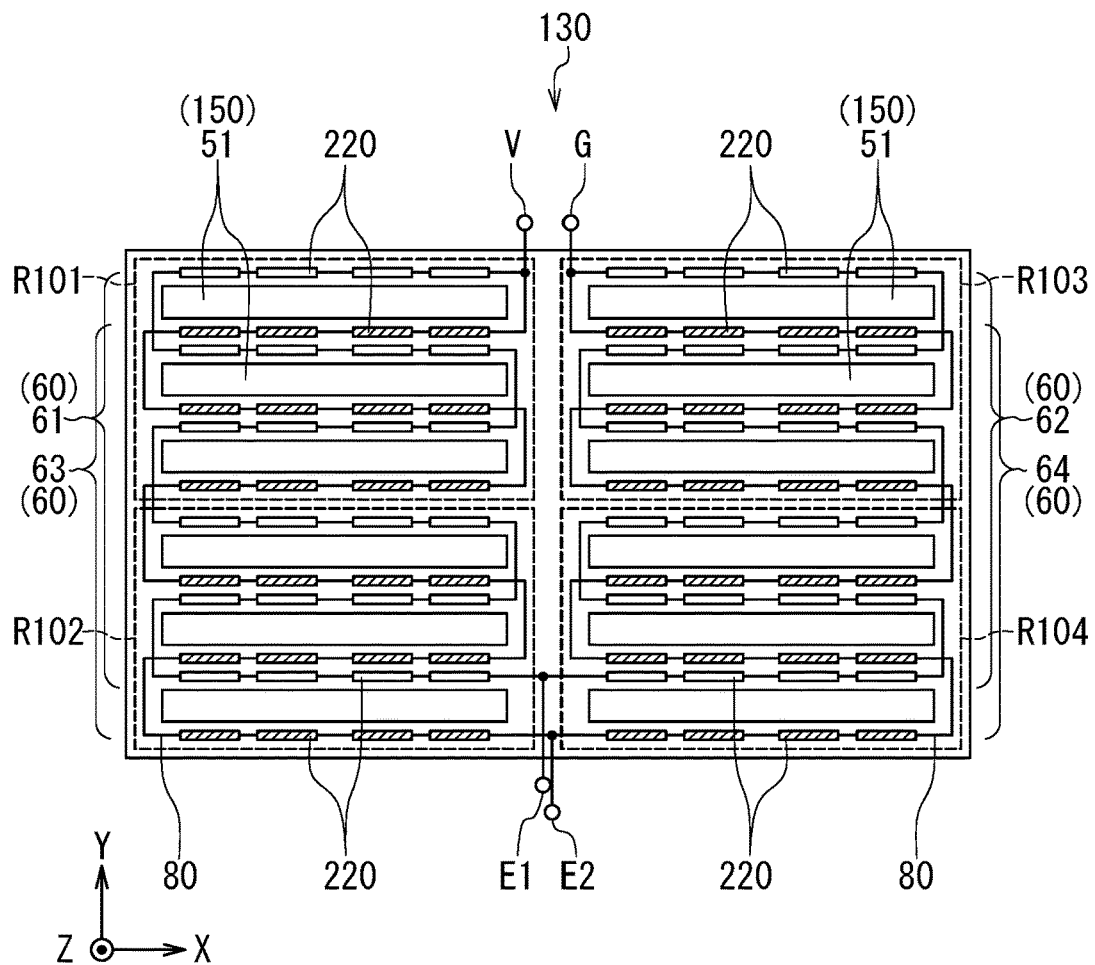
FIG. 18 is a plan view of the magnetic sensor of the comparative example.

Now, a magnetic sensor and a magnetic sensor system of a comparative example will be described. FIG. 17 is a perspective view of the magnetic sensor 130 of the comparative example. FIG. 18 is a plan view of the magnetic sensor 130 of the comparative example. The magnetic sensor 130 of the comparative example includes a magnetic field conversion unit 150 and a magnetic field detection unit 160 in place of the magnetic field conversion unit 50 and the magnetic field detection unit 60 of the present embodiment. The magnetic sensor 130 of the comparative example further includes two shields 71 and 72, as does the magnetic sensor 30 according to the embodiment. When viewed from above, the magnetic field conversion unit 150 and the magnetic field detection unit 160 are located inside the perimeter of the shields 71 and 72.

The magnetic field conversion unit 150 includes a plurality of yokes 51, as does the magnetic field conversion unit 50 of the present embodiment. However, the number of the yokes 51 in the comparative example is 12. Like the magnetic field detection unit 60 of the present embodiment, the magnetic field detection unit 160 includes first to fourth resistor sections 61 to 64, a power supply port V, a ground port a first output port E1, and a second output port E2. Each of the first to fourth resistor sections 61 to 64 includes a plurality of MR elements 220.

The magnetic sensor 130 of the comparative example differs from the magnetic sensor 30 according to the present embodiment in the orientation of the yokes 51 and the orientation of the MR elements 220. To be more specific, when viewed from above, the yokes 51 of the comparative example are oriented with their longitudinal direction in parallel to the X direction. In the comparative example, the yokes 51 are arranged such that six of the twelve yokes 51 are located in the left region and aligned in the Y direction, and the remaining six yokes 51 are located in the right region and aligned in the Y direction.

In the comparative example, the MR elements 220 are oriented with their longitudinal direction in parallel to the X direction. Further, in the comparative example, each of the element trains is constituted of two or more MR elements 220 aligned in the X direction. Two element trains are associated with one yoke 51. The two element trains are disposed near the end in the −Z direction of the yoke 51 and opposed to each other in the Y direction, with the yoke 51 in between. The magnetizations of the magnetization pinned layers 222 of the MR elements 220 in the first and third resistor sections 61 and 63 are in the Y direction, whereas the magnetizations of the magnetization pinned layers 222 of the MR elements 220 in the second and fourth resistor sections 62 and 64 are in the −Y direction.

In the comparative example, like the magnetic sensor 30 according to the present embodiment, the shields 71 and 72 when viewed from above are oriented with their longitudinal direction in parallel to the X direction. Thus, the yokes 51 and the shields 71 and 72 in the comparative example are arranged such that the longitudinal direction of the yokes 51 coincides with that of the shields 71 and 72 when viewed from above.

The configuration of the magnetic sensor 130 of the comparative example is otherwise the same as that of the magnetic sensor 30 according to the present embodiment.

The magnetic sensor system of the comparative example includes the magnetic sensor 130 of the comparative example, and a magnet 31A as a magnetic field generation unit. The positional relationship between the magnetic sensor 130 and the magnet 31A is the same as the positional relationship between the magnetic sensor 30 and the magnet 31A in the present embodiment shown in FIG. 6. The magnetic sensor 130 and the magnet 31A are configured so that a partial magnetic field, which is part of a magnetic field generated by the magnet 31A, is applied to the magnetic sensor 130. The partial magnetic field contains a first magnetic field component Hz parallel to the Z direction and a second magnetic field component Hy parallel to the Y direction.

Figure 19:
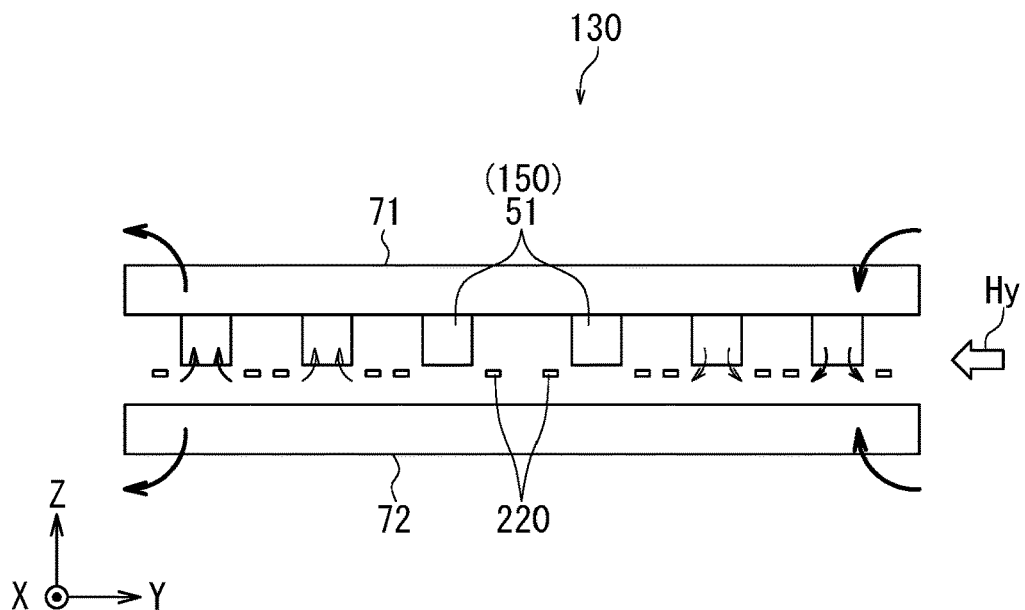
FIG. 19 is an explanatory diagram illustrating the flow of magnetic flux when a second magnetic field component is applied to the magnetic sensor of the comparative example.

Reference is now made to FIG. 19 to describe a magnetic field that is applied to the MR elements 220 due to the structures of the yokes 51 and the shields 71 and 72 when the second magnetic field component Hy is applied to the magnetic sensor 130 of the comparative example. Such a magnetic field will hereinafter be referred to as a structurally originated magnetic field.

As shown by the arrows in FIG. 19, when the second magnetic field component Hy is applied to the magnetic sensor 130 in the −Y direction, magnetic fluxes flowing into the shields 71 and 72 occur in the vicinity of the ends in the Y direction of the shields 71 and 72, and magnetic fluxes flowing out of the shields 71 and 72 occur in the vicinity of the ends in the −Y direction of the shields 71 and 72. Moreover, in association with the magnetic fluxes passing through the shield 71, magnetic fluxes flowing into or out of the yokes 51 in contact with the shield 71 occur in the vicinity of the ends in the −Z direction of the yokes 51. The closer the yokes 51 are to either end of the shield 71 in the Y direction, the higher such magnetic fluxes are. The structurally originated magnetic field is a magnetic field that is applied to the MR elements 220 due to the magnetic fluxes described above.

Figure 20:
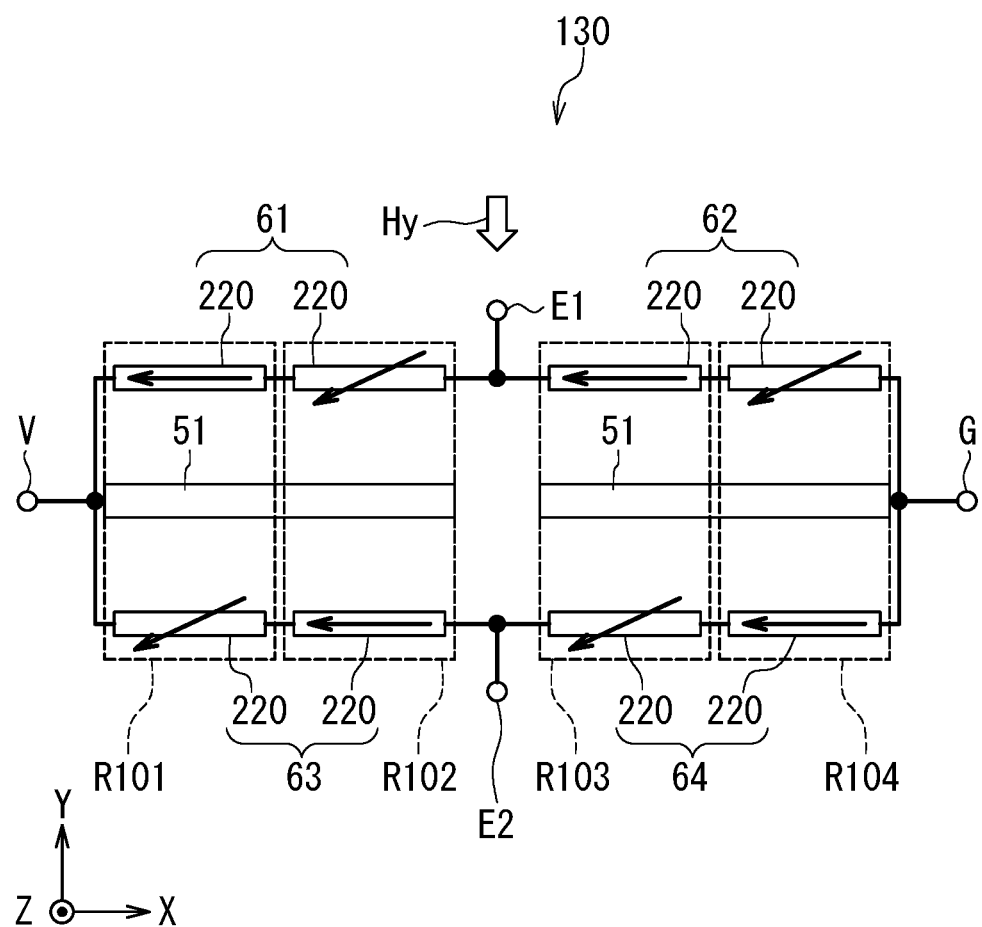
FIG. 20 is an explanatory diagram for describing the problems of the comparative example.

Next, problems of the comparative example resulting from the structurally originated magnetic field will be described with reference to FIGS. 18 to 20. FIG. 20 is an explanatory diagram for describing the problems of the comparative example resulting from the structurally originated magnetic field. Here, the strength of the first magnetic field component Hz is assumed as zero. In FIG. 20, the arrows drawn to overlap the MR elements 220 indicate the directions of magnetizations of the free layers 224 in the MR elements 220.

Four regions R101, R102, R103, and R104 shown in FIG. 18 correspond to the foregoing four regions R11, R12, R21, and R22. Half the plurality of MR elements 220 included in the first and third resistor sections 61 and 63 are located in the region R101. The other half of the plurality of MR elements 220 included in the first and third resistor sections 61 and 63 are located in the region R102. Half the plurality of MR elements 220 included in the second and fourth resistor sections 62 and 64 are located in the region R103. The other half of the plurality of MR elements 220 included in the second and fourth resistor sections 62 and 64 are located in the region R104.

FIG. 20 schematically shows the magnetic sensor 130 shown in FIG. 18. As shown in FIG. 20, each of the first and third resistor sections 61 and 63 includes MR elements 220 that are located in the region R101 and MR elements 220 that are located in the region R102. Each of the second and fourth resistor sections 62 and 64 includes MR elements 220 that are located in the region R103 and MR elements 220 that are located in the region R104.

Here, attention is focused on the rightmost MR element 220 in FIG. 19. This MR element 220 corresponds to an MR element 220 of the first resistor section 61 located in the region R101 and an MR element 220 of the second resistor section 62 located in the region R103. A magnetic field corresponding to a magnetic flux passing through the rightmost yoke 51 in FIG. 19 and a magnetic field corresponding to a magnetic flux passing through the shield 72 are applied to this MR element 220. These two magnetic fields are substantially opposite in direction and thus substantially cancel each other out. This MR element 220 is therefore hardly affected by the structurally originated magnetic field. As a result, as shown in FIG. 20, in the MR element 220 of the first resistor section 61 located in the region R101 and the MR element 220 of the second resistor section 62 located in the region R103, the magnetization direction of each free layer 224 remains parallel to the X direction which is the direction of the easy axis of magnetization.

Next, attention is focused on the second MR element 220 from the right in FIG. 19. This MR element 220 corresponds to an MR element 220 of the third resistor section 63 located in the region R101 and an MR element 220 of the fourth resistor section 64 located in the region R103. A magnetic field corresponding to the magnetic flux passing through the rightmost yoke 51 in FIG. 19 and a magnetic field corresponding to the magnetic flux passing through the shield 72 are applied to this MR element 220. These two magnetic fields do not cancel each other out since they each contain a component in the −Y direction. This MR element 220 is thus subjected to a magnetic field component in the −Y direction due to the structurally originated magnetic field. As a result, as shown in FIG. 20, in the MR element 220 of the third resistor section 63 located in the region R101 and the MR element 220 of the fourth resistor section 64 located in the region R103, the magnetization direction of each free layer 224 tilts toward the −Y direction from the direction parallel to the X direction.

Next, attention is focused on the leftmost MR element 220 in FIG. 19. This MR element 220 corresponds to an MR element 220 of the third resistor section 63 located in the region R102 and an MR element 220 of the fourth resistor section 64 located in the region R104. A magnetic field corresponding to a magnetic flux passing through the leftmost yoke 51 in FIG. 19 and a magnetic field corresponding to the magnetic flux passing through the shield 72 are applied to this MR element 220. These two magnetic fields are substantially opposite in direction and thus substantially cancel each other out. This MR element 220 is therefore hardly affected by the structurally originated magnetic field. As a result, as shown in FIG. 20, in the MR element 220 of the third resistor section 63 located in the region R102 and the MR element 220 of the fourth resistor section 64 located in the region R104, the magnetization direction of each free layer 224 remains parallel to the X direction.

Next, attention is focused on the second MR element 220 from the left in FIG. 19. This MR element 220 corresponds to an MR element 220 of the first resistor section 61 located in the region R102 and an MR element 220 of the second resistor section 62 located in the region R104. A magnetic field corresponding to the magnetic flux passing through the leftmost yoke 51 in FIG. 19 and a magnetic field corresponding to the magnetic flux passing through the shield 72 are applied to this MR element 220. These two magnetic fields do not cancel each other out since they each contain a component in the −Y direction. This MR element 220 is thus subjected to a magnetic field component in the −Y direction due to the structurally originated magnetic field. As a result, as shown in FIG. 20, in the MR element 220 of the first resistor section 61 located in the region R102 and the MR element 220 of the second resistor section 62 located in the region R104, the magnetization direction of of each free layer 224 tilts toward the −Y direction from the direction parallel to the X direction.

As can be seen from the foregoing description, in the comparative example, MR elements 220 included in the same resistor section are affected differently by the structurally originated magnetic field depending on whether the MR elements 220 are located in the region R101 or R102, or depending on whether the MR elements 220 are located in the region R103 or R104. Moreover, it is not possible to cancel out the effects of the structurally originated magnetic field on a plurality of MR elements 220 within one resistor section. Thus, in the comparative example, all the first to fourth resistor sections 61 to 64 are affected by the structurally originated magnetic field. As a result, the resistances of all the first to fourth resistor sections 61 to 64 become different from when not affected by the structurally originated magnetic field.

In the comparative example, while the magnetization directions of the free layers 224 tilt in the same direction due to the structurally originated magnetic field, the magnetization directions of the magnetization pinned layers 222 of the MR elements 220 in the first and third resistor sections 61 and 63 are different from those in the second and fourth resistor sections 62 and 64. Therefore, in the comparative example, due to the structurally originated magnetic field, the potential at each of the first and second output ports E1 and E2 when the strength of the first magnetic field component Hz is zero, which will hereinafter be referred to as the midpoint potential, deviates from that when there is no second magnetic field component Hy. As a result, in the comparative example, some error may occur in the detection value of the magnetic field detection unit 160 and/or the sensitivity of the magnetic field detection unit 160 may be reduced, due to the structurally originated magnetic field. Furthermore, in the comparative example, variations in the positions of the yokes 51 in the Y direction, i.e., a direction orthogonal to the longitudinal direction of the yokes 51, would cause variations in tilts of the magnetizations of the free layers 224 of the MR elements 220, and also variations in midpoint potential, thus leading to reduced yields of the magnetic sensor 130 of the comparative example. Such problems will hereinafter be referred to as the first problems of the comparative example.

Next, consider a case where the magnetic sensor 130 of the comparative example is arranged with the longitudinal direction of the shields 71 and 72 in parallel to the Y direction. Arranging the shields 71 and 72 in such an orientation increases the dimension of the second magnetic field component Hy in the direction of the second magnetic field component Hy and reduces a diamagnetic field to the second magnetic field component Hy, relative to the case where the shields 71 and 72 are arranged with the longitudinal direction in parallel to the X direction. As a result, the capability of the shields 71 and 72 to absorb the second magnetic field component Hy is reduced. Such a problem will hereinafter be referred to as the second problem of the comparative example. The comparative example is not capable of resolving the first and second problems at the same time.

In contrast, the present embodiment is capable of resolving the first and second problems of the comparative example at the same time. This will be discussed in detail below.

First, with reference to FIG. 21, a description will be given about a magnetic field that is applied to the MR elements 220 due to the structures of the yokes 51 and the shields 71 and 72 when the second magnetic field component Hy is applied to the magnetic sensor 30 according to the present embodiment. For the present embodiment, such a magnetic field will also be referred to as a structurally originated magnetic field, as with the comparative example.

Figure 21:
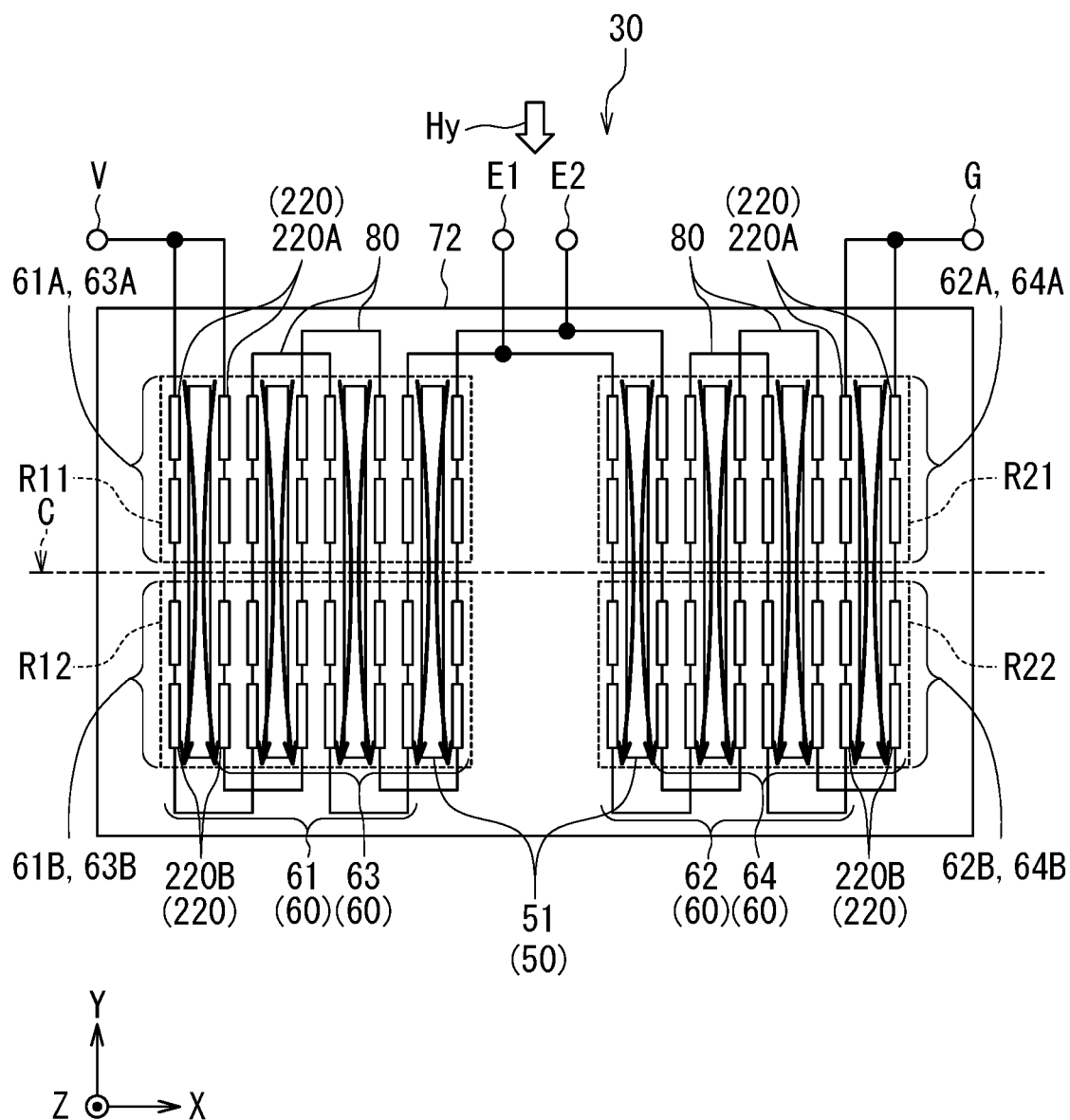
FIG. 21 is an explanatory diagram illustrating the flow of magnetic flux when the second magnetic field component is applied to the magnetic sensor according to the first embodiment of the invention.

As shown by the arrows in FIG. 21, when the second magnetic field component Hy in the −Y direction is applied to the magnetic sensor 30, there occur magnetic fluxes that flow into the yokes 51 in the vicinity of the ends in the Y direction of the yokes 51 and flow out of the yokes 51 in the vicinity of the ends in the −Y direction of the yokes 51. Due to such magnetic fluxes, the structurally originated magnetic field is applied to the MR elements 220.

Figure 22:
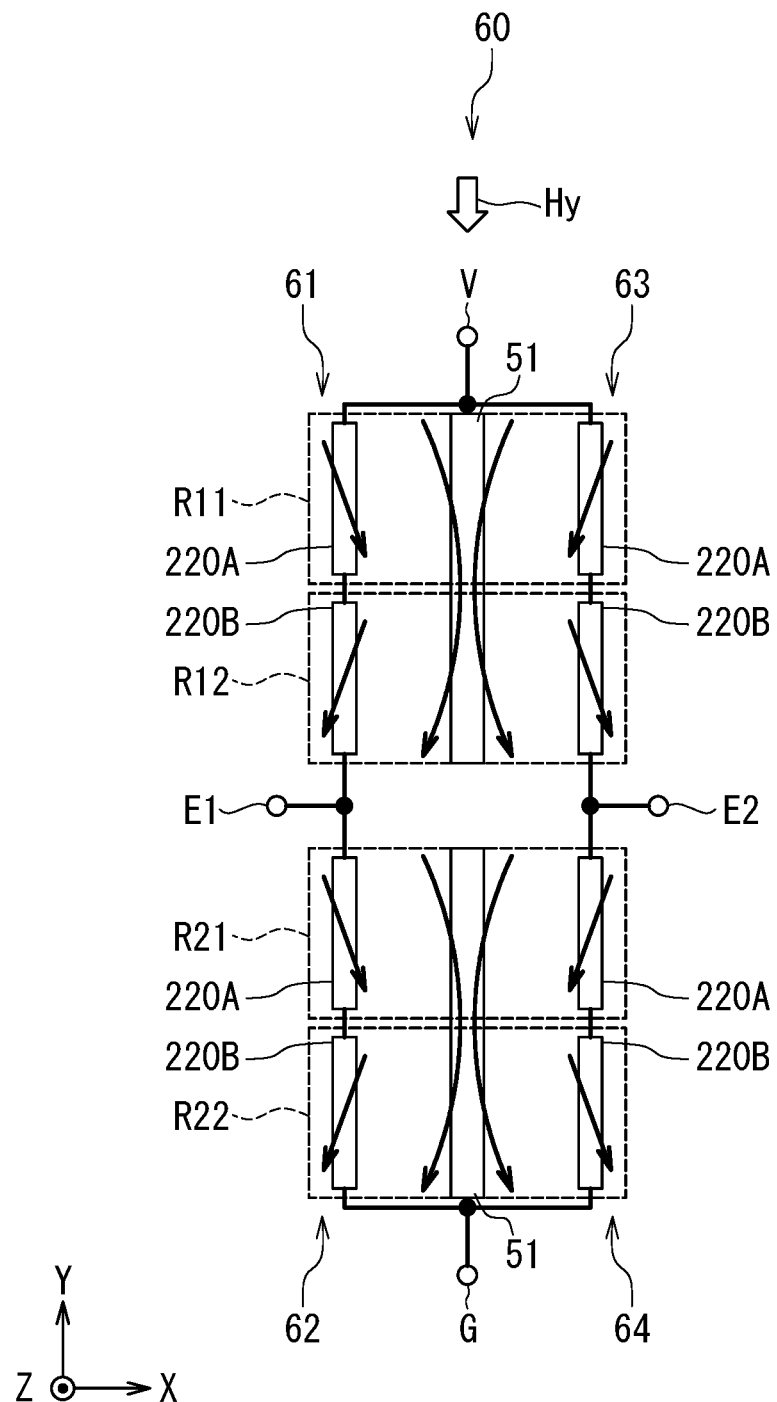
FIG. 22 is an explanatory diagram for describing the effect of the first embodiment.

FIG. 22 schematically shows the magnetic sensor 30 shown in FIG. 21. As shown in FIG. 22, each of the first and third resistor sections 61 and 63 includes MR elements 220A that are located in the region R11 and MR elements 220B that are located in the region R12. Each of the second and fourth resistor sections 62 and 64 includes MR elements 220A that are located in the region R21 and MR elements 220B that are located in the region R22.

FIG. 22 illustrates the tilts of the magnetizations of the free layers 224 of the MR elements 220 caused by the structurally originated magnetic field. Here, the strength of the first magnetic field component Hz is assumed as zero. In FIG. 22, the arrows drawn to overlap the MR elements 220 indicate the magnetization directions of the free layers 224 of the respective MR elements 220.

Due to the effect of the structurally originated magnetic field, as shown in FIG. 22, in the first MR element 220A of the first resistor section 61 located in the region R11 and the first MR element 220A of the second resistor section 62 located in the region R21, the magnetization direction of each free layer 224 tilts toward the X direction from the direction parallel to the Y direction. In the second MR element 220B of the first resistor section 61 located in the region R12 and the second MR element 220B of the second resistor section 62 located in the region R22, the magnetization direction of each free layer 224 tilts toward the −X direction from the direction parallel to the Y direction.

In the first MR element 220A of the third resistor section 63 located in the region R11 and the first MR element 220A of the fourth resistor section 64 located in the region R21, the magnetization direction of each free layer 224 tilts toward the −X direction from the direction parallel to the Y direction. In the second MR element 220B of the third resistor section 63 located in the region R12 and the second MR element 220B of the fourth resistor section 62 located in the region R22, the magnetization direction of each free layer 224 tilts toward the X direction from the direction parallel to the Y direction.

In the present embodiment, in any of the first to fourth resistor sections 61 to 64, the magnetization direction of the free layer 224 of the first MR element 220A and the magnetization direction of the free layer 224 of the second MR element 220B tilt in mutually opposite directions due to the structurally originated magnetic field. This enables cancellation of the effects of the structurally originated magnetic field on the first and second MR elements 220A and 220B in any of the first to fourth resistor sections 61 to 64. The reason is that the first MR element 220A and the second MR element 220B are located to be symmetric with respect to the central cross section C. In this way, the present embodiment enables reduction of the effect of the structurally originated magnetic field on the magnetic field detection unit 60. In other words, the present embodiment resolves the first problems of the comparative example.

In the present embodiment, by virtue of the foregoing operation, the amounts of deviation of the midpoint potentials at the first and second output ports E1 and E2 occurring due to the structurally originated magnetic field are smaller than in the comparative example. Further, in the present embodiment, even if the positions of the yokes 51 vary in the X direction which is a direction orthogonal to the longitudinal direction, the tilt of the magnetization of the free layer 224 of the first MR element 220A occurring due to the structurally originated magnetic field and the tilt of the magnetization of the free layer 224 of the second MR element 220B occurring due to the structurally originated magnetic field are almost equal in magnitude in any of the first to fourth resistor sections 61 to 64. As a result, according to the present embodiment, variations in the midpoint potentials due to variations in the positions of the yokes 51 become smaller than in the comparative example.

The present embodiment is also able to resolve the second problem of the comparative example, as described below. The shields 71 and 72 of the present embodiment are arranged with their longitudinal direction in parallel to the X direction when viewed from above. Arranging the shields 71 and 72 in such an orientation reduces the dimension of the shields 71 and 72 in the direction of the second magnetic field component Hy, and increases a diamagnetic field to the second magnetic field component Hy, relative to the case where the shields 71 and 72 are arranged with their longitudinal direction in parallel to the Y direction when viewed from above. The present embodiment thereby increases the capability of the shields 71 and 72 to absorb the second magnetic field component Hy. In other words, the present embodiment resolves the second problem of the comparative example.

For the reasons described above, the present embodiment resolves the first and second problems of the comparative example at the same time.

Now, a description will be given of experimental results demonstrating that a decrease in the dimension of the shields 71 and 72 in the direction of the second magnetic field component Hy improves the capability of the shields 71 and 72 to absorb the second magnetic field component Hy.

The experiment used first to third samples of the magnetic sensor 30 according to the present embodiment with the shape of the shields 71 and 72 varied from sample to sample. The first and second samples were ones corresponding to the magnetic sensor 30 shown in FIGS. 7 and 8. The shields 71 and 72 of the first sample each had a dimension of 100 μm in the Y direction. The shields 71 and 72 of the second sample each had a dimension of 90 μm in the Y direction.

The third sample was a sample including two shields 71 separated from each other and aligned in the Y direction, and two shields 72 separated from each other and aligned in the Y direction, in place of the single shield 71 and the single shield 72, respectively, of the magnetic sensor 30 shown in FIGS. 7 and 8. In the third sample, the two shields 71 and the two shields 72 each had a dimension of 50 μm in the Y direction. In any of the first to third samples, the shields 71 and 72 each had a dimension of 180 μm in the X direction.

Here, the sensitivity of the magnetic sensor 30 is defined as the ratio of a change in the detection value of the magnetic sensor 30 to a change in the magnetic flux density corresponding to the output magnetic field component. In the experiment, the sensitivities of the magnetic sensors 30 were determined with the magnetic flux density corresponding to the first magnetic field component Hz varied within the range of −50 to 50 mT. The magnetic flux density corresponding to the first magnetic field component Hz is expressed in a positive value when the first magnetic field component Hz is in the Z direction. The magnetic flux density corresponding to the first magnetic field component Hz is expressed in a negative value when the first magnetic field component Hz is in the −Z direction. Further, in the experiment, the second magnetic field component Hy in the −Y direction was applied to the magnetic sensors 30, and a relationship between the magnetic flux density corresponding to the second magnetic field component Hy and the sensitivity of the magnetic sensor 30 was determined with the magnetic flux density corresponding to the second magnetic field component Hy varied within the range of 0 to 300 mT.

Figure 23:
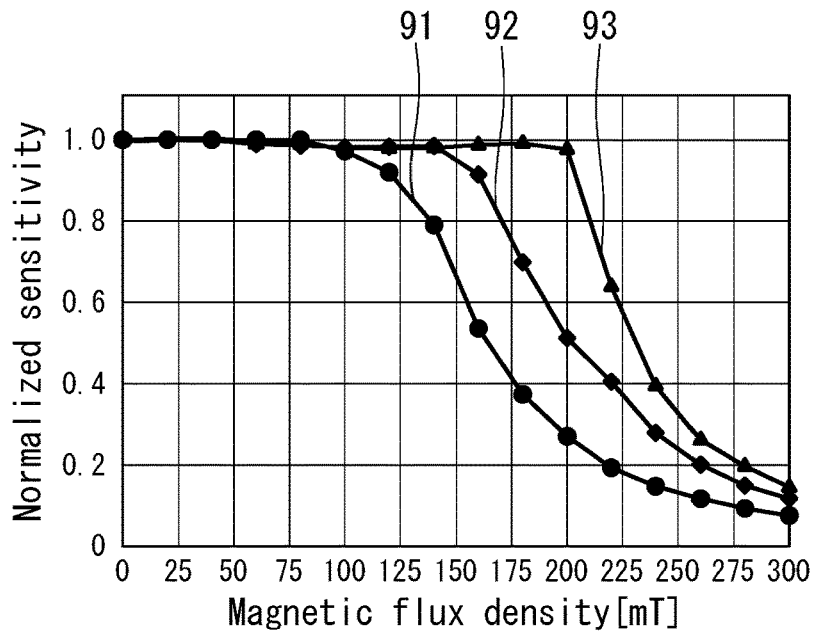
FIG. 23 is a characteristic diagram illustrating the relationship between the shape of a shield and the capability of the shield.

FIG. 23 shows the experimental result. In FIG. 23, the horizontal axis represents the magnetic flux density corresponding to the second magnetic field component Hy. In FIG. 23, the vertical axis represents normalized sensitivity. The normalized sensitivity refers to a value obtained by dividing the sensitivity of the magnetic sensor 30 when the magnetic flux density corresponding to the second magnetic field component Hy has any value by the sensitivity of the magnetic sensor 30 when the magnetic flux density corresponding to the second magnetic field component Hy is 0. In FIG. 23, the curve 91 represents the normalized sensitivity of the first sample, the curve 92 represents the normalized sensitivity of the second sample, and the curve 93 represents the normalized sensitivity of the third sample.

As shown in FIG. 23, the normalized sensitivity of each of the first to third samples is almost 1 over a range of the magnetic flux density corresponding to the second magnetic field component Hy from 0 to a certain value. When the magnetic flux density corresponding to the second magnetic field component Hy exceeds such a certain value, the normalized sensitivity decreases. It is considered that as the magnetic flux density corresponding to the second magnetic field component Hy is increased and when the magnetic fluxes in each of the shields 71 and 72 reach saturation, the normalized sensitivity starts to decrease. When the magnetic fluxes in each of the shields 71 and 72 are saturated, a portion of the second magnetic field component Hy not absorbed by the shield 71 or 72 is applied to the magnetic field detection unit 60, and the normalized sensitivity drops accordingly. In other words, the higher the value of the magnetic flux density at which the normalized sensitivity starts to decrease, the higher the capability of the shields 71 and 72 to absorb the second magnetic field component Hy. As shown in FIG. 23, the value of the magnetic flux density at which the normalized sensitivity starts to decrease is the lowest for the first sample, and the highest for the third sample. As can be seen from this result, the capability of the shields 71 and 72 to absorb the second magnetic field component Hy improves as the dimension of the shields 71 and 72 in the Y direction or the direction of the second magnetic field component Hy decreases.

The reason why the capability of the shields 71 and 72 to absorb the second magnetic field component Hy improves as the dimension of the shields 71 and 72 in the direction of the second magnetic field component Hy decreases is considered to be that the strength of a diamagnetic field occurring in the shields 71 and 72 due to the second magnetic field component Hy increases with decreasing dimension of the shields 71 and 72 in the direction of the second magnetic field component Hy.

The description so far has dealt with the magnetic sensor 30 disposed on the inner side of the coil 41 (see FIG. 1) and the magnetic sensor system 101 including this magnetic sensor 30. The magnetic sensor 30 and the magnetic sensor system 101 described above will hereinafter be referred to as a magnetic sensor and a magnetic sensor system of a first example.

For the camera module 100 shown in FIGS. 1 to 3, not only the magnetic sensor and magnetic sensor system of the first example but also the magnetic sensor 30 disposed on the inner side of the coil 44 (see FIG. 1) and a magnetic sensor system including this magnetic sensor 30 can be the magnetic sensor and the magnetic sensor system according to the present embodiment. The magnetic sensor 30 disposed on the inner side of the coil 44 and the magnetic sensor system including this magnetic sensor 30 will hereinafter be referred to as a magnetic sensor and a magnetic sensor system of a second example.

The magnetic sensor and the magnetic sensor system of the second example are basically the same in configuration as the magnetic sensor and the magnetic sensor system of the first example. In the second example, however, the X direction corresponds to the second direction in the present invention, and the Y direction corresponds to the third direction in the present invention. The foregoing description of the first example thus applies to the second example if the magnet 31A, the X direction, and the Y direction in the description are replaced with the magnet 34A, the Y direction, and the X direction, respectively. The magnetic sensor system of the second example is a position detection device for detecting the position of the magnet 34A relative to the magnetic sensor 30 in a direction parallel to the X direction.

Second Embodiment

Figure 24:
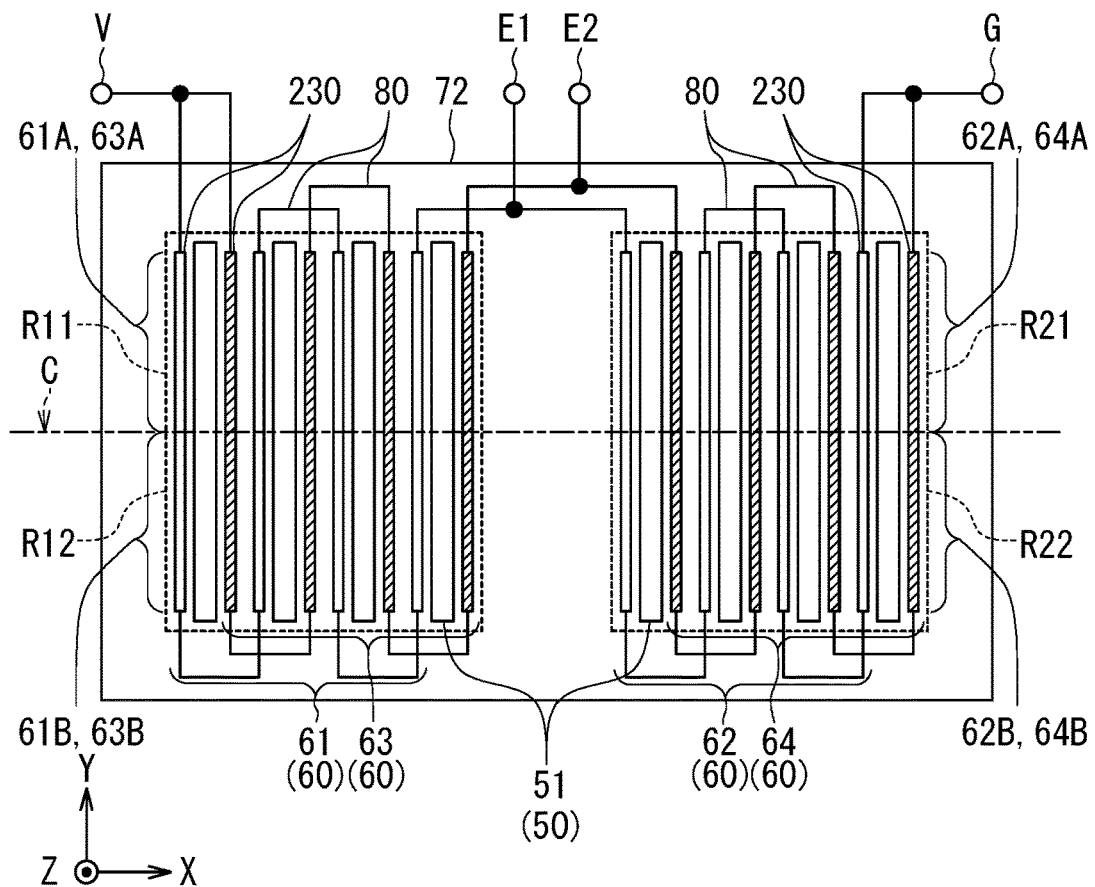
FIG. 24 is a plan view of a magnetic sensor according to a second embodiment of the invention.

A second embodiment of the invention will now be described. First, reference is made to FIG. 24 to describe the configuration of a magnetic sensor according to the second embodiment. FIG. 24 is a plan view of the magnetic sensor according to the second embodiment.

In the magnetic sensor 30 according to the present embodiment, each of the first to fourth resistor sections 61 to 64 includes at least one MR element 230 in place of the plurality of MR elements 220 in the first embodiment. In the example shown in FIG. 24, each of the first to fourth resistor sections 61 to 64 includes four MR elements 230. A single element train in the first embodiment is replaced with a single MR element 230. Two MR elements 230 are associated with one yoke 51. Each of the MR elements 230 is shaped to be long in a direction parallel to the Y direction. The two MR elements 230 associated with one yoke 51 are disposed near the end in the −Z direction of the yoke 51 and opposed to each other in the X direction, with the yoke 51 in between. In the example shown in FIG. 24, the number of the yokes 51 is eight and the number of the MR elements 230 is sixteen.

As in the first embodiment, a region that coincides with the shield 72 when viewed from above will be referred to as a shield projection region. Of the shield projection region, a portion from the center in the X direction to the end in the −X direction will be referred to as a left region, and a portion from the center in the X direction to the end in the X direction will be referred to as a right region. In the example shown in FIG. 24, four of the eight yokes 51 are located in the left region, and the remaining four yokes 51 are located in the right region.

The MR elements 230 included in the first and third resistor sections 61 and 63 are located in the left region. The MR elements 230 included in the second and fourth resistor sections 62 and 64 are located in the right region. In FIG. 24, the MR elements 230 included in the third resistor section 63 and the MR elements 230 included in the fourth resistor section 64 are hatched.

The MR elements 230 included in the first and third resistor sections 61 and 63 are associated with the four yokes 51 located in the left region. One MR element 230 of the first resistor section 61 associated with one yoke 51 is located on the −X side of the yoke 51. One MR element 230 of the third resistor section 63 associated with one yoke 51 is located on the X side of the yoke 51.

The MR elements 230 included in the second and fourth resistor sections 62 and 64 are associated with the four yokes 51 located in the right region. One MR element 230 of the second resistor section 62 associated with one yoke 51 is located on the −X side of the yoke 51. One MR element 230 of the fourth resistor section 64 associated with one yoke 51 is located on the X side of the yoke 51.

As in the first embodiment, the first resistor section 61 includes a first portion 61A and a second portion 61B, the second resistor section 62 includes a first portion 62A and a second portion 62B, the third resistor section 63 includes a first portion 63A and a second portion 63B, and the fourth resistor section 64 includes a first portion 64A and a second portion 64B. In the present embodiment, the first portion and the second portion of each of the first to fourth resistor sections 61 to 64 are mutually different portions of the at least one MR element 230. In the example shown in FIG. 24, the first portion and the second portion of each of the first to fourth resistor sections 61 to 64 are mutually different portions of an aggregate of four MR elements 230.

The left region includes a region R11 and a region R12, and the right region includes a region R21 and a region R22. The definitions of the regions R11, R12, R21 and R22 are the same as in the first embodiment. The first portion 61A of the first resistor section 61 and the first portion 63A of the third resistor section 63 are included in the region R11. The second portion 61B of the first resistor section 61 and the second portion 63B of the third resistor section 63 are included in the region R12. The first portion 62A of the second resistor section 62 and the first portion 64A of the fourth resistor section 64 are included in the region R21. The second portion 62B of the second resistor section 62 and the second portion 64B of the fourth resistor section 64 are included in the region R22.

In each of the first to fourth resistor sections 61 to 64, the first portion and the second portion are located to be symmetric with respect to a central cross section C. The central cross section C is a cross section perpendicular to the Y direction and passing through the center in the Y direction of at least one yoke 51. In the example shown in FIG. 24, the central cross section C passes through the centers of all the yokes 51.

An example of configuration of the MR elements 230 will now be described. Like the MR elements 220 of the first embodiment, the MR elements 230 each include a magnetization pinned layer having a magnetization in a predetermined direction, a free layer having a magnetization whose direction is variable according to an applied magnetic field, a gap layer disposed between the magnetization pinned layer and the free layer, and an antiferromagnetic layer. In the present embodiment, specifically, the MR elements 230 are GMR elements of the current-in-plane (CIP) type in which a sense current for use in magnetic signal detection is fed in a direction generally parallel to the plane of the layers constituting the MR elements 230. The gap layer is a nonmagnetic conductive layer.

In the present embodiment, in each of the first and third resistor sections 61 and 63, the magnetization pinned layers of the MR elements 230 have magnetizations in the X direction. In each of the second and fourth resistor sections 62 and 64, the magnetization pinned layers of the MR elements 230 have magnetizations in the −X direction.

The operation and effect of the magnetic sensor 30 according to the present embodiment will now be described. The present embodiment enables cancellation of the effects of the structurally originated magnetic field on the first and second portions of each of the first to fourth resistor sections 61 to 64. The reason is that the first portion and the second portion are located to be symmetric with respect to the central cross section C. In this way, the present embodiment reduces the effect of the structurally originated magnetic field on the magnetic field detection unit 60.

The configuration, operation and effects of the present embodiment are otherwise the same as those of the first embodiment.

The present invention is not limited to the foregoing embodiments, and various modifications may be made thereto. For example, as far as the requirements of the appended claims are met, the shapes, numbers and locations of the MR elements, the yokes and the shields are not limited to the respective examples illustrated in the foregoing embodiments, but can be freely chosen.

Further, the magnetic field detection unit 60 may be configured to include the power supply port V, the ground port G the first output port E1 and the first and second resistor sections 61 and 62, and include none of the second output port E2 and the third and fourth resistor sections 63 and 64. In such a case, the detection value depends on the electric potential at the first output port E1.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A magnetic sensor comprising: a magnetic field conversion unit; a magnetic field detection unit; and at least one shield formed of a soft magnetic material, wherein
    the magnetic field conversion unit includes a plurality of yokes formed of a soft magnetic material,
    each of the plurality of yokes is configured to receive an input magnetic field for the magnetic sensor and to output an output magnetic field,
    the input magnetic field contains an input magnetic field component in a direction parallel to a first direction,
    when viewed in the direction parallel to the first direction, each of the plurality of yokes has such a shape that a length in a second direction of the yoke is longer than a width in a third direction of the yoke, the second direction intersecting the first direction, the third direction intersecting the first and second directions,
    the output magnetic field contains an output magnetic field component in a direction parallel to the third direction, the output magnetic field component varying according to the input magnetic field component,
    the magnetic field detection unit is configured to receive the output magnetic field and to generate a detection value that varies according to the output magnetic field component,
    the magnetic field detection unit includes a plurality of magnetoresistive elements,
    at least two magnetoresistive elements of the plurality of magnetoresistive elements are associated with each of the plurality of yokes,
    the at least two magnetoresistive elements are disposed to be symmetric and opposed to each other in the third direction, with one yoke in between, the one yoke being a yoke with which the at least two magnetoresistive elements of the plurality of yokes are associated,
    when viewed in the direction parallel to the first direction, the at least one shield has such a shape that a maximum dimension in the second direction of the at least one shield is smaller than a maximum dimension in the third direction of the at least one shield, and is located to overlap the magnetic field conversion unit and the magnetic field detection unit, and
    the at least one shield includes a shield in contact with the plurality of yokes, and the at least one shield reduces a strength of magnetic field in at least the second direction.

2. The magnetic sensor according to claim 1, wherein, when viewed in the direction parallel to the first direction, the magnetic field conversion unit and the magnetic field detection unit are located inside a perimeter of the at least one shield.

3. The magnetic sensor according to claim 1, wherein the first, second and third directions are orthogonal to one another.

4. The magnetic sensor according to claim 1, wherein
    each of the plurality of magnetoresistive elements includes a magnetization pinned layer having a magnetization in a predetermined direction, and a free layer having a magnetization whose direction is variable according to an applied magnetic field, and
    the detection value varies according to an angle that the direction of the magnetization of the free layer forms with the direction of the magnetization of the magnetization pinned layer.

5. The magnetic sensor according to claim 4, wherein the direction of the magnetization of the magnetization pinned layer is parallel to the third direction.

6. The magnetic sensor according to claim 4, wherein the magnetic field detection unit includes a first portion and a second portion, the first portion and the second portion being located to be symmetric with respect to a central cross section, the central cross section being a cross section perpendicular to the second direction and passing through centers in the second direction of all of the plurality of yokes.

7. The magnetic sensor according to claim 6, wherein
the plurality of magnetoresistive elements include a first magnetoresistive element included in the first portion of the magnetic field detection unit, and a second magnetoresistive element included in the second portion of the magnetic field detection unit, and
the first magnetoresistive element and the second magnetoresistive element are located to be symmetric with respect to the central cross section, and are connected to each other in series.

8. The magnetic sensor according to claim 6, wherein the first portion and the second portion are mutually different portions of an aggregate of the plurality of magnetoresistive elements.

9. The magnetic sensor according to claim 1, wherein
the magnetic field detection unit includes a power supply port configured to receive a predetermined voltage, a ground port connected to a ground, an output port, a first resistor section provided between the power supply port and the output port, and a second resistor section provided between the output port and the ground port,
each of the first and second resistor sections includes a first portion and a second portion, the first portion and the second portion being located to be symmetric with respect to a central cross section, the central cross section being a cross section perpendicular to the second direction and passing through centers in the second direction of all of the plurality of yokes,
each of the first and second resistor sections includes at least one magnetoresistive element of the plurality of magnetoresistive elements,
each of the plurality of magnetoresistive elements includes a magnetization pinned layer having a magnetization in a predetermined direction, and a free layer having a magnetization whose direction is variable according to an applied magnetic field, and
the detection value depends on an electric potential at the output port.

10. The magnetic sensor according to claim 1, wherein
the magnetic field detection unit includes a power supply port configured to receive a predetermined voltage, a ground port connected to a ground, a first output port, a second output port, a first resistor section provided between the power supply port and the first output port, a second resistor section provided between the first output port and the ground port, a third resistor section provided between the power supply port and the second output port, and a fourth resistor section provided between the second output port and the ground port,
each of the first to fourth resistor sections includes a first portion and a second portion, the first portion and the second portion being located to be symmetric with respect to a central cross section, the central cross section being a cross section perpendicular to the second direction and passing through centers in the second direction of all of the plurality of yokes,
each of the first to fourth resistor sections includes at least one magnetoresistive element of the plurality of magnetoresistive elements,
each of the magnetoresistive elements includes a magnetization pinned layer having a magnetization in a predetermined direction, and a free layer having a magnetization whose direction is variable according to an applied magnetic field, and
the detection value depends on a potential difference between the first output port and the second output port.

11. The magnetic sensor according to claim 1, wherein the input magnetic field contains a magnetic field component in a direction parallel to the second direction, in addition to the input magnetic field component.

12. A magnetic sensor system comprising: the magnetic sensor according to claim 1; and a magnetic field generation unit for generating a predetermined magnetic field, wherein
the magnetic sensor and the magnetic field generation unit are configured so that a partial magnetic field is applied to the magnetic sensor, the partial magnetic field being part of the predetermined magnetic field,
the partial magnetic field contains a first magnetic field component in a direction parallel to the first direction, and a second magnetic field component in a direction parallel to the second direction,
the input magnetic field is the partial magnetic field, and the input magnetic field component is the first magnetic field component.

13. The magnetic sensor system according to claim 12, wherein the magnetic sensor and the magnetic field generation unit are configured so that the first magnetic field component varies as a position of the magnetic field generation unit relative to the magnetic sensor varies.

* * * * *